(12) United States Patent
Park et al.

(10) Patent No.: US 12,393,232 B2
(45) Date of Patent: Aug. 19, 2025

(54) PROTECTIVE FILM AND DISPLAY DEVICE INCLUDING THE SAME

(71) Applicant: SAMSUNG DISPLAY CO., LTD., Yongin-si (KR)

(72) Inventors: Cheuljin Park, Yongin-si (KR); Kisang Yoo, Yongin-si (KR); Hyunkyung Yun, Yongin-si (KR); Joonik Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 281 days.

(21) Appl. No.: 18/206,294

(22) Filed: Jun. 6, 2023

(65) Prior Publication Data

US 2023/0400888 A1   Dec. 14, 2023

(30) Foreign Application Priority Data

Jun. 10, 2022  (KR) .......................... 10-2022-0071034

(51) Int. Cl.
  *G06F 1/16*   (2006.01)
  *H10K 59/80*  (2023.01)

(52) U.S. Cl.
  CPC ......... *G06F 1/1656* (2013.01); *H10K 59/873* (2023.02)

(58) Field of Classification Search
  CPC ..... G06F 1/1656; G06F 1/1626; B32B 7/027; B32B 7/028
  See application file for complete search history.

(56) References Cited

U.S. PATENT DOCUMENTS

| | | | |
|---|---|---|---|
| 6,811,841 B1* | 11/2004 | Castiglione | B32B 27/18 428/34 |
| 10,095,190 B2 | 10/2018 | Kim | |
| 11,169,567 B2* | 11/2021 | Chipping | G06F 1/1626 |
| 2005/0249946 A1* | 11/2005 | Hsu | C09J 7/50 428/354 |
| 2020/0176696 A1* | 6/2020 | Dai | H10K 50/841 |
| 2020/0401185 A1* | 12/2020 | Won | B32B 38/10 |
| 2021/0124399 A1 | 4/2021 | Jeaong | |
| 2023/0106605 A1 | 4/2023 | Yoo | |

(Continued)

FOREIGN PATENT DOCUMENTS

| | | |
|---|---|---|
| KR | 1020170027929 A | 3/2017 |
| KR | 1020210019799 | 2/2021 |
| KR | 1020210048633 A | 6/2021 |

(Continued)

*Primary Examiner* — Anthony Q Edwards
(74) *Attorney, Agent, or Firm* — CANTOR COLBURN LLP

(57) ABSTRACT

A protective film and a display device including the protective film are provided. The protective film includes: a first layer having a middle area, a first side area connected to a first edge of the middle area, a second side area connected to a second edge intersecting with the first edge of the middle area, and a corner area connecting the first side area to the second side area, a second layer disposed on the first layer and exposing at least a portion of at least one of the corner area, the first side area, and the second side area of the first layer, and a third layer disposed on the exposed at least a portion of the at least one of the corner area, the first side area, and the second side area of the first layer, the third layer being a shape memory alloy.

20 Claims, 41 Drawing Sheets

(56) References Cited

U.S. PATENT DOCUMENTS

2023/0107898 A1  4/2023  Lee et al.
2023/0126098 A1  4/2023  Yun et al.

FOREIGN PATENT DOCUMENTS

| KR | 1020230048207 A | 4/2023 |
| KR | 1020230048208 A | 4/2023 |
| KR | 1020230058208 A | 4/2023 |

* cited by examiner

PROTECTIVE FILM AND DISPLAY DEVICE INCLUDING THE SAME

This application claims priority to Korean Patent Application No. 10-2022-0071034, filed on Jun. 10, 2022, and all the benefits accruing therefrom under 35 U.S.C. § 119, the content of which in its entirety is herein incorporated by reference.

BACKGROUND

1. Field

One or more embodiments relate to a device, and more particularly, to a protective film and a display device including the protective film.

2. Description of Related Art

A mobile electronic device has a wide range of uses. A tablet personal computer ("PCs") has been used as the mobile electronic device, in addition to a small electronic device, such as a mobile phone.

The mobile electronic device includes a display device for providing visual information, such as images or moving images, to users in order to support various functions. As components for driving the display device have become smaller, a portion occupied by the display device in the electronic device has increased in size, and the display device having a structure that may be bent to have a certain angle from a flat state has been developed.

SUMMARY

A protective film may be disposed on one surface of a display panel to protect the display panel. When the protective film and the display panel are used in a display device in which all surfaces thereof are round, a corner area of the display panel may not be round due to the protective film. One or more embodiments include a protective film where a corner area of a display panel is easily maintained round, and a display device including the protective film.

Additional aspects will be set forth in part in the description which follows and, in part, will be apparent from the description, or may be learned by practice of the presented embodiments of the disclosure.

According to one or more embodiments, a protective film includes: a first layer having a middle area, a first side area connected to a first edge of the middle area, a second side area connected to a second edge intersecting with the first edge of the middle area, and a corner area connecting the first side area to the second side area, a second layer disposed on the first layer and exposing at least a portion of at least one of the corner area, the first side area, and the second side area of the first layer, and a third layer disposed on the exposed at least a portion of the at least one of the corner area, the first side area, and the second side area of the first layer, the third layer being a shape memory alloy.

A planar shape of the third layer may be a sectoral shape.

The third layer may include a first portion disposed on the corner area, and a second portion disposed on the first side area or the second side area.

The third layer may be disposed on an edge of the corner area, and the second layer may be disposed on a portion of the corner area except for the edge.

The corner area may include a first area and a second area, where the second layer may cover the middle area, the first side area, the second side area, and the first area of the first layer and expose the second area of the first layer.

The third layer may be disposed on the second area.

The first area may be provided in plurality and the second area may be provided in plurality, and the plurality of first areas and the plurality of second areas may be alternately arranged in the corner area.

The second layer may include a metal.

At least a portion of a planar shape of the third layer may be round.

The first layer may include an embossed member, a cushion layer connected to the embossed member, and an outer skin layer connected to the cushion layer.

According to one or more embodiments, a display device includes a cover member, a display panel disposed on one surface of the cover member, and a protective film disposed on one surface of the display panel, where the protective film includes a first layer having a middle area, a first side area connected to a first edge of the middle area, a second side area connected to a second edge intersecting with the first edge of the middle area, and a corner area connecting the first side area to the second side area, a second layer disposed on the first layer and exposing at least a portion of at least one of the corner area, the first side area, and the second side area of the first layer, and a third layer disposed on the exposed at least a portion of the at least one of the corner area, the first side area, and the second side area of the first layer, the third layer being a shape memory alloy.

A planar shape of the third layer may be a sectoral shape.

The third layer may include a first portion disposed on the corner area, and a second portion disposed on the first side area or the second side area.

The third layer may be disposed on an edge of the corner area, and the second layer may be disposed on a portion of the corner area except for the edge.

The corner area may include a first area and a second area, where the second layer may cover the middle area, the first side area, the second side area, and the first area of the first layer and expose the second area of the first layer.

The third layer may be disposed on the second area.

The first area may be provided in plurality and the second area may be provided in plurality, and the plurality of first areas and the plurality of second areas may be alternately arranged in the corner area.

The second layer may include a metal.

At least a portion of a planar shape of the third layer may be round.

The first layer may include an embossed member, a cushion layer connected to the embossed member, and an outer skin layer connected to the cushion layer.

The above and other aspects, features, and advantages of certain embodiments of the disclosure will be more apparent from the following description, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
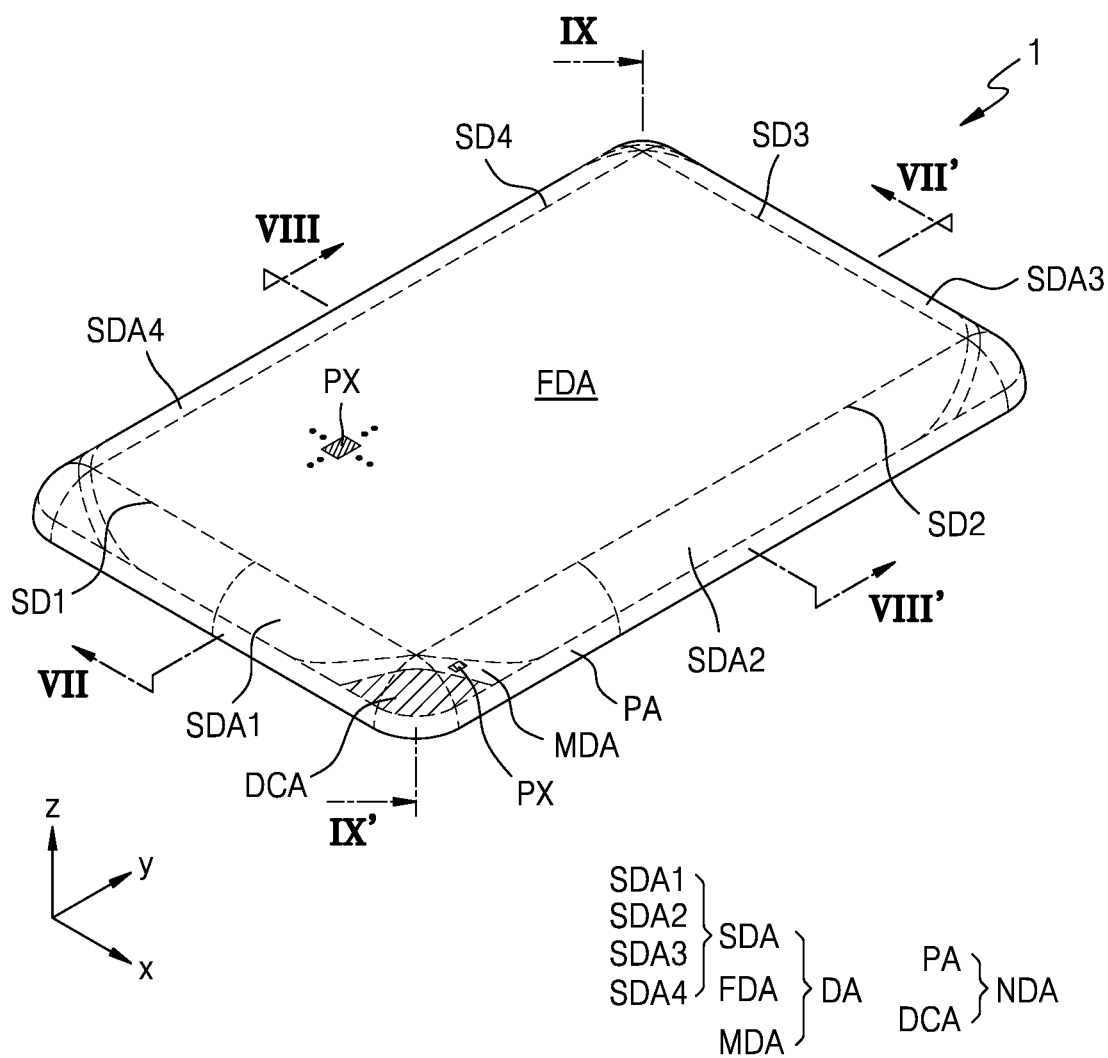
FIG. 1A is a schematic perspective view illustrating a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as that of "at least one element," unless the context clearly indicates otherwise. "At least one" is not to be construed as limiting to "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. "At least one" is not to be construed as limiting "a" or "an."

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

Hereinafter, the present embodiments are described in detail with reference to the accompanying drawings. In the drawings, the same reference numerals are given to the same or corresponding elements, and repeated description thereof is omitted.

It will be understood that although terms such as "first" and "second" may be used herein to describe various components, these components should not be limited by these terms and these terms are only used to distinguish one component from another component.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "a first component," "a first region," "a first layer" or "a first section" discussed below could be termed a second element, a second component, a second region, a second layer or a second section without departing from the teachings herein.

Also, it will be understood that the terms "comprise," "include," and "have" used herein specify the presence of stated features or components, but do not preclude the presence or addition of one or more other features or components.

Also, it will be understood that when a layer, region, or component is referred to as being "located on" another layer, region, or component, it may be "directly" or "indirectly" located on the another layer, region, or component, that is, for example, one or more intervening layers, regions, or components may be located therebetween.

Sizes of components in the drawings may be exaggerated for convenience of description. In other words, because the sizes and thicknesses of components in the drawings are arbitrarily illustrated for convenience of description, the present disclosure is not limited thereto.

The x-axis, the y-axis, and the z-axis are not limited to three axes of the rectangular coordinate system and may be interpreted in a broader sense. For example, the x axis, the y axis, and the z axis may be perpendicular to each other, or may represent different directions that are not perpendicular to each other.

When a certain embodiment may be implemented differently, a particular process order may be performed differently from the described order. For example, two consecutively described processes may be performed substantially at the same time or performed in an order opposite to the described order.

FIG. 1A is a schematic perspective view illustrating a display device 1 according to an embodiment.

Referring to FIG. 1A, the display device 1 may be used as display screens of various products, such as a television, a notebook computer, a monitor, a billboard, and Internet of Things ("IOT") device, as well as portable electronic devices, such as a mobile phone, a smartphone, a tablet personal computer (PC), a mobile communication terminal, an electronic notebook, an electronic book, a portable multimedia player (PMP), a navigation system, and an ultra-mobile PC ("UMPC").

In an embodiment, the display device 1 may have a rectangular shape in a plan view. In another embodiment, the display device 1 may have various shapes, such as a polygon (e.g., a triangle or a quadrangle), a circle, and an oval. For example, when the display device 1 has the shape of a polygon in a plan view, a corner of the polygon may be round. Hereinafter, for convenience of description, a case, in which the display device 1 has a quadrangular shape with round corners in a plan view, is given.

The display device 1 may have a short side in a first direction (e.g., an x direction or a −x direction) and a long side in a second direction (e.g., a y direction or a −y direction). In another embodiment, in the display device 1, the length of the side in the first direction (e.g., the x direction or the −x direction) and the length of the side in the second direction (e.g., the y direction or the −y direction) may be equal to each other. In another embodiment, the display device 1 may have a long side in the first direction (e.g., the x direction or the −x direction) and a short side in the second direction (e.g., the y direction or the −y direction).

Each corner where the short side in the first direction (e.g., the x direction or the −x direction) meets the long side in the second direction (e.g., the y direction or the −y direction) may be round with a certain curvature.

The display device 1 may include a display area DA and a non-display area NDA located outside the display area DA. A plurality of pixels PX may be arranged in the display area DA, and an image may be provided through an array of the plurality of pixels PX. Each of the plurality of pixels PX may be defined as a region where light is emitted by light-emitting devices included in the display device 1. For example, each of the plurality of pixels PX may include a red sub-pixel, a green sub-pixel, and a blue sub-pixel. Alternatively, each of the plurality of pixels PX may include a red sub-pixel, a green sub-pixel, a blue sub-pixel, and a white sub-pixel.

According to an embodiment, the display area DA may include a main display area FDA, an auxiliary display area SDA, and an intermediate display area MDA. A plurality of pixels PX may be arranged in each of the main display area FDA, the auxiliary display area SDA, and the intermediate display area MDA.

The main display area FDA may include a flat surface. In an embodiment, the ratio of the main display area FDA to the display area DA of the display device 1 may be the largest, and thus, the main display area FDA may provide most images.

At least a portion of the auxiliary display area SDA may be bent and include a curved surface, and may extend outwardly from each edge of the main display area FDA. In an embodiment, the auxiliary display area SDA may include a first auxiliary display area SDA1, a second auxiliary display area SDA2, a third auxiliary display area SDA3, and a fourth auxiliary display area SDA4. In some embodiments, at least one of the first auxiliary display area SDA1, the second auxiliary display area SDA2, the third auxiliary display area SDA3, and the fourth auxiliary display area SDA4 may be omitted.

In an embodiment, the first auxiliary display area SDA1 may be adjacent to a first edge SD1 of the main display area FDA, and may extend outwardly from the first edge SD1 in the −y direction. The second auxiliary display area SDA2 may be adjacent to a second edge SD2 of the main display area FDA, and may extend outward from the second edge SD2 in the x direction. The third auxiliary display area SDA3 may be adjacent to a third edge SD3 of the main display area FDA, and may extend outward from the third edge SD3 in the y direction. The fourth auxiliary display area SDA4 may be adjacent to a fourth edge SD4 of the main display area FDA, and may extend outward from the fourth edge SD4 in the −x direction. In this case, the first auxiliary display area SDA1 and the third auxiliary display area SDA3 may be on opposite sides with the main display area FDA therebetween, and the second auxiliary display area SDA2 and the fourth auxiliary display area SDA4 may be on opposite sides with the main display area FDA therebetween.

As shown in FIG. 1A, each of the first to fourth auxiliary display areas SDA1, SDA2, SDA3, and SDA4 may include a curved surface bent with a constant curvature. For example, the first auxiliary display area SDA1 and the third auxiliary display area SDA3 may have curved surfaces bent around a bending axis extending in the x direction, and the second auxiliary display area SDA2 and the fourth auxiliary display area SDA4 may have curved surfaces bent around a bending axis extending in the y direction. Curvatures of the first to fourth auxiliary display areas SDA1, SDA2, SDA3, and SDA4 may be the same or different from each other. For example, the curvature of the first auxiliary display area SDA1 may be the same as the curvature of the third auxiliary display area SDA3, and the curvature of the second auxiliary display area SDA2 may be the same as the curvature of the fourth auxiliary display area SDA4. For example, the curvature of the first auxiliary display area SDA1 may be different from the curvature of the second auxiliary display area SDA2. As another example, the curvature of the first auxiliary display area SDA1 may be the same as the curvature of the second auxiliary display area SDA2.

The intermediate display area MDA may be between the main display area FDA and a display device corner area DCA to be described below. Also, the intermediate display area MDA may be located between the auxiliary display area SDA and the display device corner area DCA. The intermediate display area MDA may extend between the main display area FDA and the display device corner area DCA and between the auxiliary display area SDA and the display device corner area DCA. As shown in FIG. 1A, when the display device 1 has a quadrangular shape in a plan view, four intermediate display areas MDA may be provided.

In an embodiment, the intermediate display area MDA may include a plurality of pixels PX, and a driver or the like for providing an electrical signal or power to each display area DA may be arranged in the intermediate display area MDA. In some embodiments, the pixels PX located in the intermediate display area MDA may be arranged to overlap each other above the driver or the like located in the intermediate display area MDA in a plan view. In some embodiments, a pixel circuit driving the pixels PX located in the intermediate display area MDA may be arranged in the main display area FDA, the auxiliary display area SDA, and/or the display device corner area DCA, which are adjacent to the intermediate display area MDA.

The display device 1 of FIG. 1A may display an image not only in the main display area FDA but also in the auxiliary display area SDA and the intermediate display area MDA. Accordingly, the proportion of the display area DA in the display device 1 may increase. That is, in the display device 1 having the same size, the area of the non-display area NDA may decrease and the area of the display area DA may increase.

The pixel PX is not arranged in the non-display area NDA of the display device 1, and thus, the non-display area NDA may be an area that does not provide an image. The non-display area NDA may include a peripheral area PA outside the display area DA. The peripheral area PA may completely or partially surround the display area DA. A driver or the like for providing an electrical signal or power to the display area DA may be arranged in the peripheral area PA.

In an embodiment, the non-display area NDA may include a display device corner area DCA. The display device corner area DCA may be located at a corner where two adjacent edges of the main display area FDA meet each other. For example, the display device corner area DCA may be located at a corner where the first edge SD1 and the second edge SD2 of the main display area FDA meet each other, and the display device corner area DCA may be adjacent to the first auxiliary display area SDA1 and the second auxiliary display area SDA2. As shown in FIG. 1A, when the display device 1 has a quadrangular shape in a plan view, four display device corner areas DCA may be provided.

Because the display device corner area DCA is located between adjacent auxiliary display areas SDA having curved surfaces bent in different directions, the display device corner area DCA may include a curved surface in which curved surfaces bent in various directions are continuously connected to each other. Also, when the curvatures of the adjacent auxiliary display areas SDA are different from each other, the curvature of the display device corner area DCA may gradually change along the edge of the display device 1. For example, when the curvature of the first auxiliary display area SDA1 and the curvature of the second auxiliary display area SDA2 are different from each other, the display device corner area DCA between the first auxiliary display area SDA1 and the second auxiliary display area SDA2 may have a curvature that gradually changes according to position.

Although the first auxiliary display area SDA1 and the second auxiliary display area SDA2 and the display device corner area DCA therebetween have been described as an example, the above description may be similarly applied to the other three display device corner areas DCA.

Figure 1B:
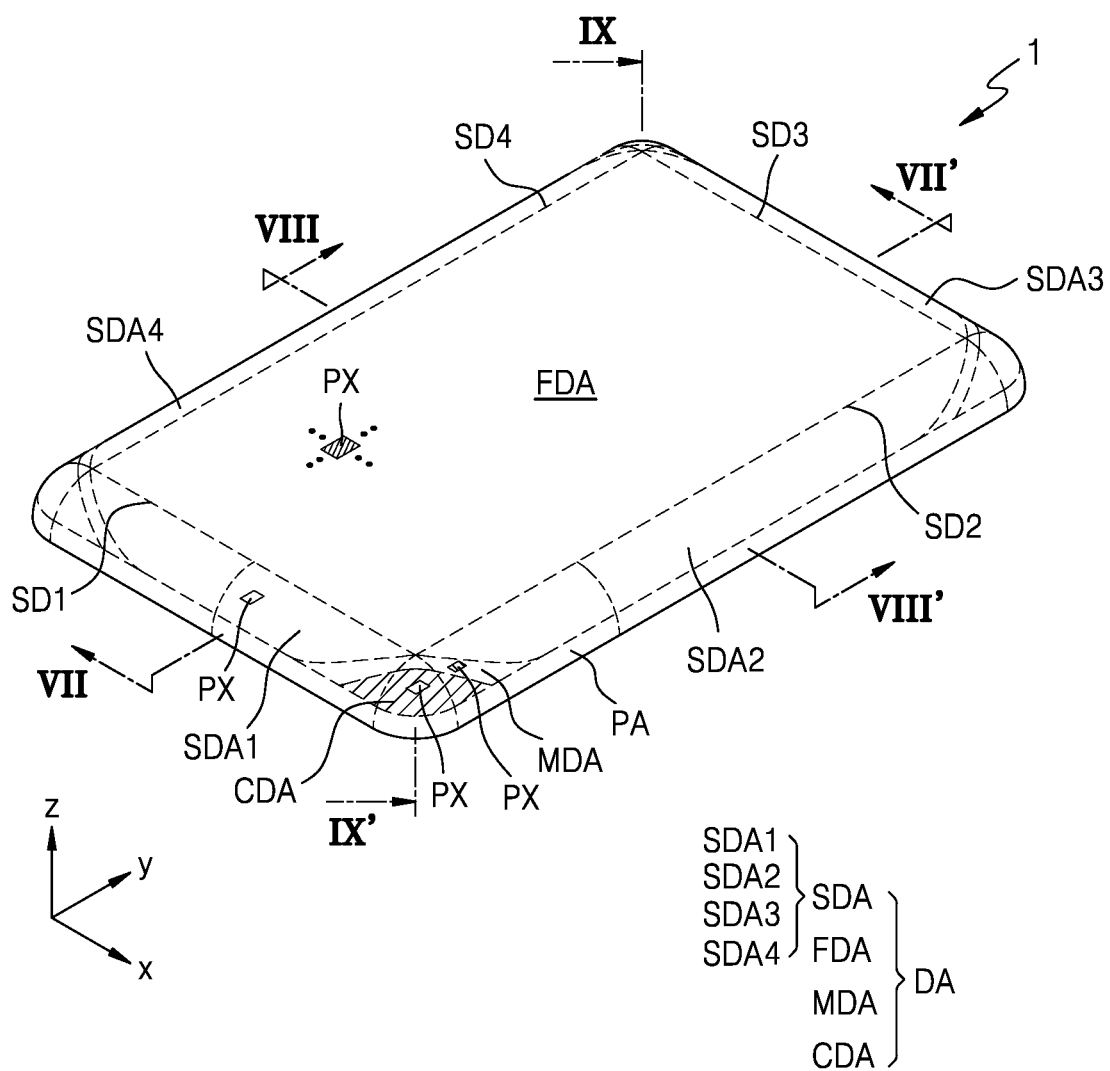
FIG. 1B is a schematic perspective view illustrating a display device according to another embodiment.

FIG. 1B is a schematic perspective view illustrating a display device 1 according to another embodiment. Descriptions that are the same as those previously given with reference to FIG. 1A are omitted, and differences are mainly described below.

Referring to FIG. 1B, a display area DA may include a main display area FDA, an auxiliary display area SDA, an intermediate display area MDA, and a corner display area CDA. A plurality of pixels PX may be arranged in each of the main display area FDA, the auxiliary display area SDA, the intermediate display area MDA, and the corner display area CDA. The descriptions of the main display area FDA and the auxiliary display area SDA are the same as those given above with reference to FIG. 1A and thus are omitted.

The intermediate display area MDA may be between the main display area FDA and the corner display area CDA to be described below. Also, the intermediate display area MDA may be located between the auxiliary display area SDA and the corner display area CDA. The intermediate display area MDA may extend between the main display area FDA and the corner display area CDA and between the auxiliary display area SDA and the corner display area CDA. As shown in FIG. 1B, when the display device 1 has a quadrangular shape in a plan view, four intermediate display areas MDA may be provided. In some embodiments, a pixel circuit driving the pixels PX located in the intermediate display area MDA may be arranged in the main display area FDA, the auxiliary display area SDA, and/or the corner display area CDA, which are adjacent to the intermediate display area MDA.

The corner display area CDA may be disposed on a corner side of the display device 1 and may include a curved surface. Here, the corner of the display device 1 may be a region where a short side of the display device 1 in a first direction (e.g., an x direction or a −x direction) meets a long side of the display device 1 in a second direction (e.g., a y direction or a −y direction). As shown in FIG. 1B, when the display device 1 has a quadrangular shape in a plan view, four corner display areas CDA may be provided.

The corner display area CDA may be located at a corner where two edges of the main display area FDA meet each other. That is, the corner display area CDA may be adjacent to two auxiliary display areas SDA. For example, the corner display area CDA may be located at a corner where a first edge SD1 and a second edge SD2 of the main display area FDA meet each other, and may be adjacent to a first auxiliary display area SDA1 and a second auxiliary display area SDA2.

Because the corner display area CDA is located between adjacent auxiliary display areas SDA having curved surfaces bent in different directions, the corner display area CDA may include a curved surface in which curved surfaces bent in various directions are continuously connected to each other. Also, when the curvatures of the adjacent auxiliary display areas SDA are different from each other, the curvature of the corner display area CDA may gradually change along the edge of the display device 1. For example, when the curvature of the first auxiliary display area SDA1 and the curvature of the second auxiliary display area SDA2 are different from each other, the corner display area CDA between the first auxiliary display area SDA1 and the second auxiliary display area SDA2 may have a curvature that gradually changes according to position.

Although the first auxiliary display area SDA1 and the second auxiliary display area SDA2 and the corner display area CDA therebetween have been described as an example, the above description may be similarly applied to the other three corner display areas CDA.

The display device 1 of FIG. 1B may display an image in the corner display area CDA as well as in the main display area FDA, the auxiliary display area SDA, and the intermediate display area MDA. Accordingly, the proportion of the display area DA in the display device 1 may further increase. That is, in the display device 1 having the same size, the area of a non-display area NDA may decrease and the area of the display area DA may increase. In addition, the display device 1 may include a corner display area CDA at the corner thereof, which includes a curved surface and displays an image, thereby improving aesthetics.

The non-display area NDA of the display device 1 of FIG. 1B may include a peripheral area PA outside the display area DA. In an embodiment, the peripheral area PA may entirely surround the main display area FDA, four auxiliary display areas SDA, and four corner display areas CDA.

Hereinafter, the display device 1 of FIG. 1B is described as an example for convenience of description, but the following descriptions may equally apply to the display device 1 of FIG. 1A.

Figure 2:
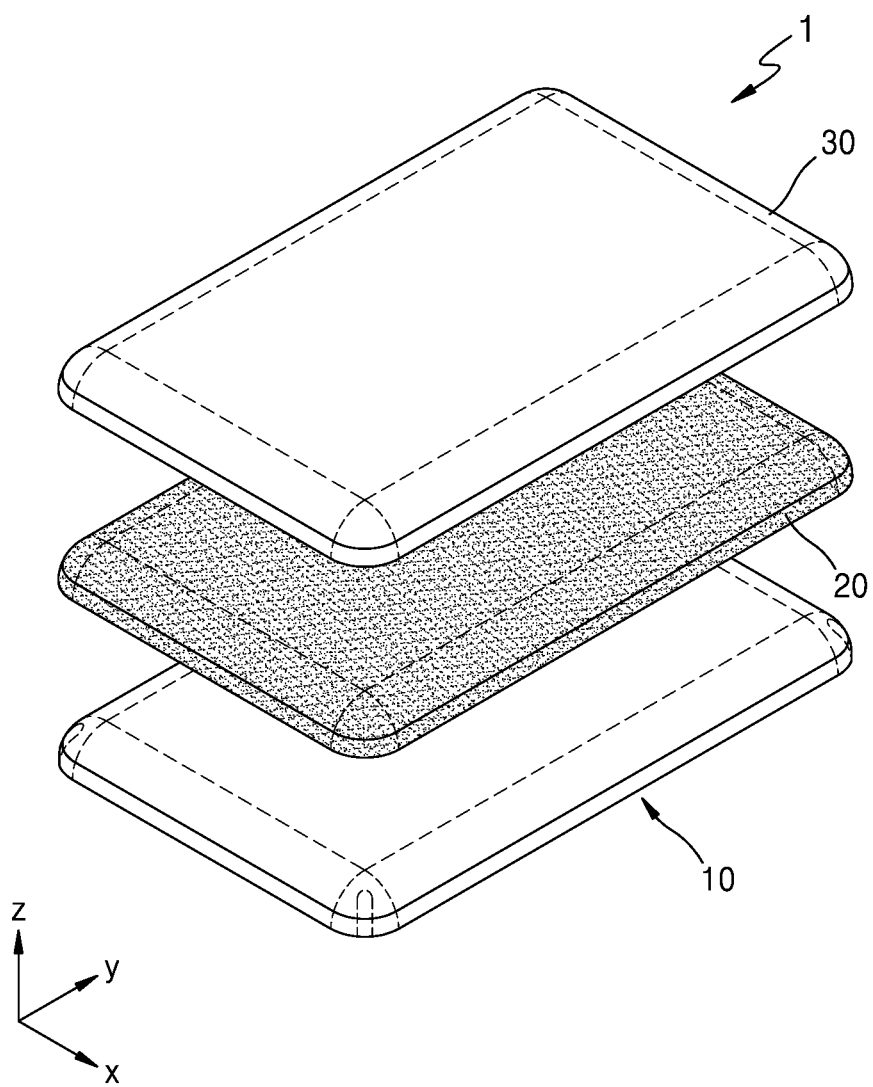
FIG. 2 is a schematic exploded perspective view illustrating a display panel and a cover window of a display device according to embodiments.

FIG. 2 is a schematic exploded perspective view illustrating a display panel 20 and a cover window 30 of a display device 1 according to embodiments.

Referring to FIG. 2, the display device 1 may include a protective film 10, a display panel 20, and a cover window 30. The cover window 30 may be disposed on the front surface of the display panel 20. Here, the 'front surface' of the display panel 20 may be defined as a surface facing a direction in which the display panel 20 provides an image.

According to an embodiment, the cover window 30 may be arranged to cover the front surface of the display panel 20. The cover window 30 may protect the front surface of the display panel 20. In addition, the cover window 30 forms the exterior of the display device 1 and thus may include a flat surface and a curved surface corresponding to the shape described above of the display device 1.

The cover window 30 may be attached to the display panel 20 by an adhesive layer (not shown). The adhesive layer may include, for example, an adhesive member, such as an optical clear adhesive ("OCA") or a pressure sensitive adhesive ("PSA").

The cover window 30 may have a high transmittance to transmit light emitted from the display panel 20, and may have a small thickness to minimize the weight of the display device 1. Also, the cover window 30 may have strong strength and hardness to protect the display panel 20 from external impact. For example, the cover window 30 may be a flexible window. The cover window 30 may be easily bent according to an external force without cracking and the like to protect the display panel 20. As another example, the cover window 30 may include glass, sapphire, or plastic. For example, the cover window 30 may be ultra-thin glass) (UTG®) having strength provided by a method, such as chemical strengthening or thermal strengthening. In another embodiment, the cover window 30 may include UTG® or colorless polyimide ("CPI"). In an embodiment, the cover window 30 may have a structure in which a flexible polymer layer is disposed on one surface of a glass substrate, or may be include only a polymer layer.

An image implemented in the display panel 20 may be provided to a user through the cover window 30 that is transparent. That is, it may be understood that an image provided by the display device 1 is implemented by the display panel 20, and thus, it may be understood that the display area DA (refer to FIG. 1B) and the non-display area NDA (refer to FIG. 1B) of the display device 1 described above are provided in the display panel 20.

The protective film 10 may be disposed on the rear surface of the display panel 20. That is, the protective film 10 may be disposed on one surface of the display panel 20, opposite to the other surface of the display panel 20 on which the cover window 30 is disposed. In this case, the protective film 10 may not only protect the display panel 20 from the outside but also absorb impact from the cover window 30 or the like. The protective film 10 may be disposed at the edge of the cover window 30, and may define a groove therein from which a portion of the protective film 10 is removed.

Figure 3:
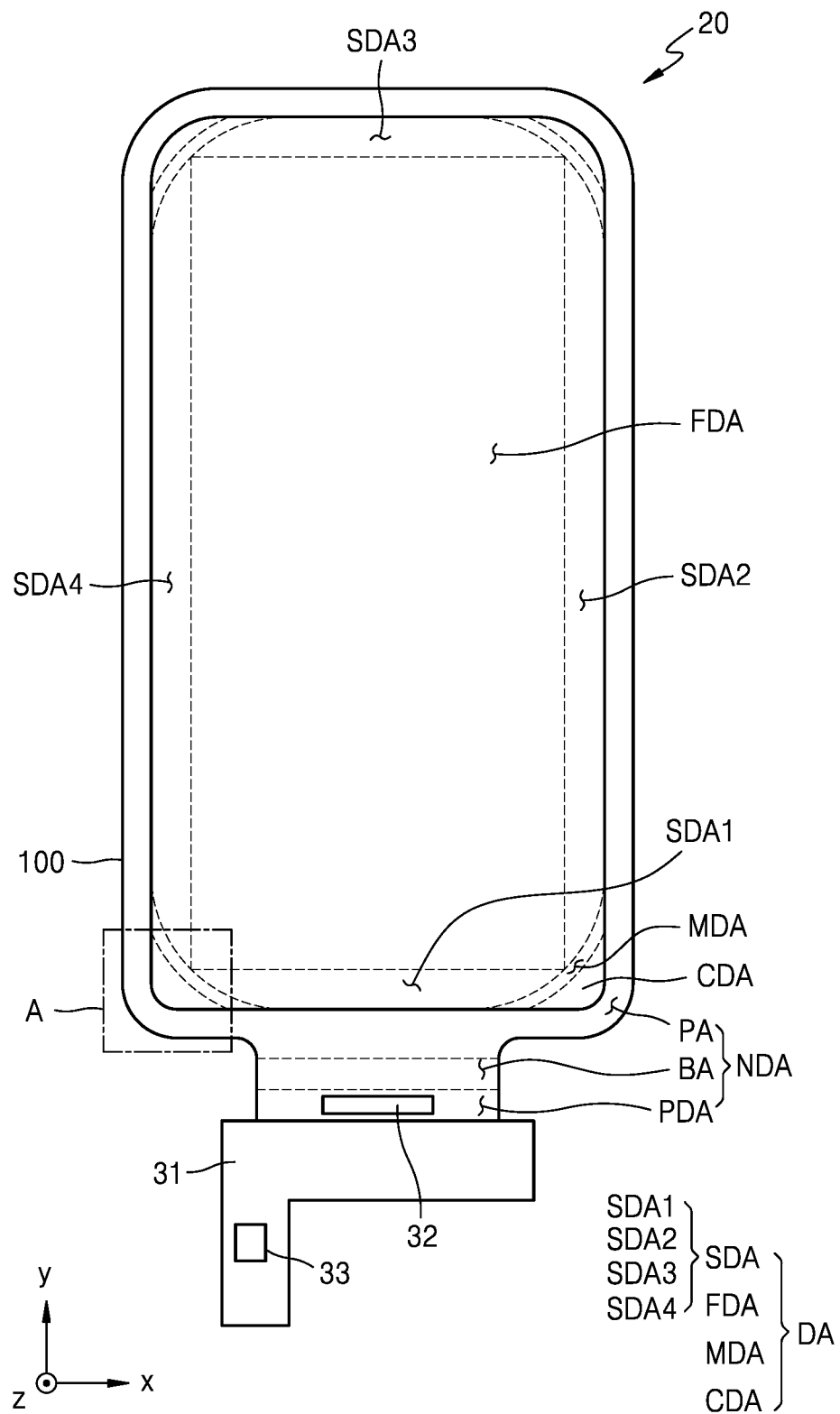
FIG. 3 is a schematic plan view illustrating a portion of a display panel included in a display device according to embodiments.

FIG. 3 is a schematic plan view illustrating a portion of a display panel 20 included in a display device 1 according to embodiments.

Referring to FIG. 3, a display area DA and a non-display area NDA of the display panel 20 may correspond to the display area DA and the non-display area NDA of the display device 1, respectively, described with reference to FIG. 1A or 1B. For example, a display panel 20 included in the display device 1 shown in FIG. 1A may include a display area DA and a non-display area NDA. The display area DA of the display panel 20 may include a main display area FDA, an auxiliary display area SDA, and an intermediate display area MDA. In addition, the non-display area NDA of the display panel 20 may include a display device corner area DCA corresponding to a corner display area CDA, a peripheral area PA outside the display area DA, a bending area BA disposed on one side of the peripheral area PA, and a pad area PDA that is apart from the peripheral area PA with the bending area BA therebetween. In another embodiment, a display panel 20 included in the display device 1 shown in FIG. 1B may include a display area DA and a non-display area NDA. The display area DA of the display panel 20 may include a main display area FDA, an auxiliary display area SDA, an intermediate display area MDA, and a corner display area CDA. The non-display area NDA of the display panel 20 may include a peripheral area PA outside the display area DA, a bending area BA disposed on one side of the peripheral area PA, and a pad area PDA that is apart from the peripheral area PA with the bending area BA therebetween. For convenience of description, a case in which, as shown in FIG. 3, the peripheral area PA entirely surrounds the display area DA will be described.

In an embodiment, the display panel 20 may bend in the bending area BA and accordingly, the display area DA and the pad area PDA overlap each other in a thickness direction (i.e., a z direction) of the display panel 20. That is, the pad area PDA may bend to overlap the display area DA on the rear surface of the display panel 20 in a plan view (i.e., in the thickness direction). Accordingly, in the display device 1, the area of the non-display area NDA may be reduced and the proportion of the display area DA may be increased.

A display driver 32 and a display circuit board 31 may be arranged in the pad area PDA. The display driver 32 may receive control signals and power voltages, and may generate and output signals and voltages for driving the display panel 20. The display driver 32 may include an integrated circuit.

The display circuit board 31 may be electrically connected to the display panel 20. For example, although not shown in FIG. 3, the display circuit board 31 may be electrically connected, through an anisotropic conductive film, to a pad portion (not shown) located in the pad area PDA.

The display circuit board 31 may be a flexible printed circuit board ("FPCB") that may bend or a rigid printed circuit board ("RPCB") that is rigid and does not easily bend. In some cases, the display circuit board 31 may be a composite printed circuit board including both an RPCB and a FPCB.

A sensor driver 33 may be disposed on the display circuit board 31. The sensor driver 33 may include an integrated circuit. The sensor driver 33 may be attached on or embedded in the display circuit board 31. The sensor driver 33 may be electrically connected to sensing electrodes of a touch sensing layer of the display panel 20 through the display circuit board 31.

In addition, a power supplier (not shown) for supplying voltages for driving pixel circuits of the display panel 20, a scan driver, and the display driver 32 may be additionally disposed on the display circuit board 31. In some embodiments, the power supplier may be integrated with the display driver 32, and in this case, the display driver 32 and the power supplier may be implemented as a single integrated circuit.

Also, the display circuit board 31 may be electrically connected to a main circuit board (not shown). The main circuit board may include a main processor including a central processing unit ("CPU"), a graphics processing unit ("GPU"), a memory, a communication chip, a digital signal processor ("DSP"), an instruction set processor ("ISP"), and various types of interfaces, for example, an application processor ("AP").

The display panel 20 may include a substrate 100, and various components constituting the display panel 20 may be disposed on the substrate 100. For example, a plurality of light-emitting devices forming the display area DA, pixel circuits driving each of the plurality of light-emitting devices, signal lines and/or voltage lines providing electrical signals and/or voltages to each of the pixel circuits, and driving circuits may be disposed on the substrate 100. The display driver 32 and the display circuit board 31 may also be disposed on the substrate 100. In an embodiment, the display driver 32 and the display circuit board 31 may be disposed in an upper portion of the substrate 100. In another embodiment, when wiring is formed by drilling a hole in the substrate 100, the display driver 32 and the display circuit board 31 may be disposed in a lower portion of the substrate 100. In another embodiment, although not shown in the drawings, the display driver 32 may be disposed on the display circuit board 31. In another embodiment, although not shown in the drawings, the display driver 32 may be disposed on an anisotropic conductive film connecting the display circuit board 31 to the display panel 20.

Figure 4A:
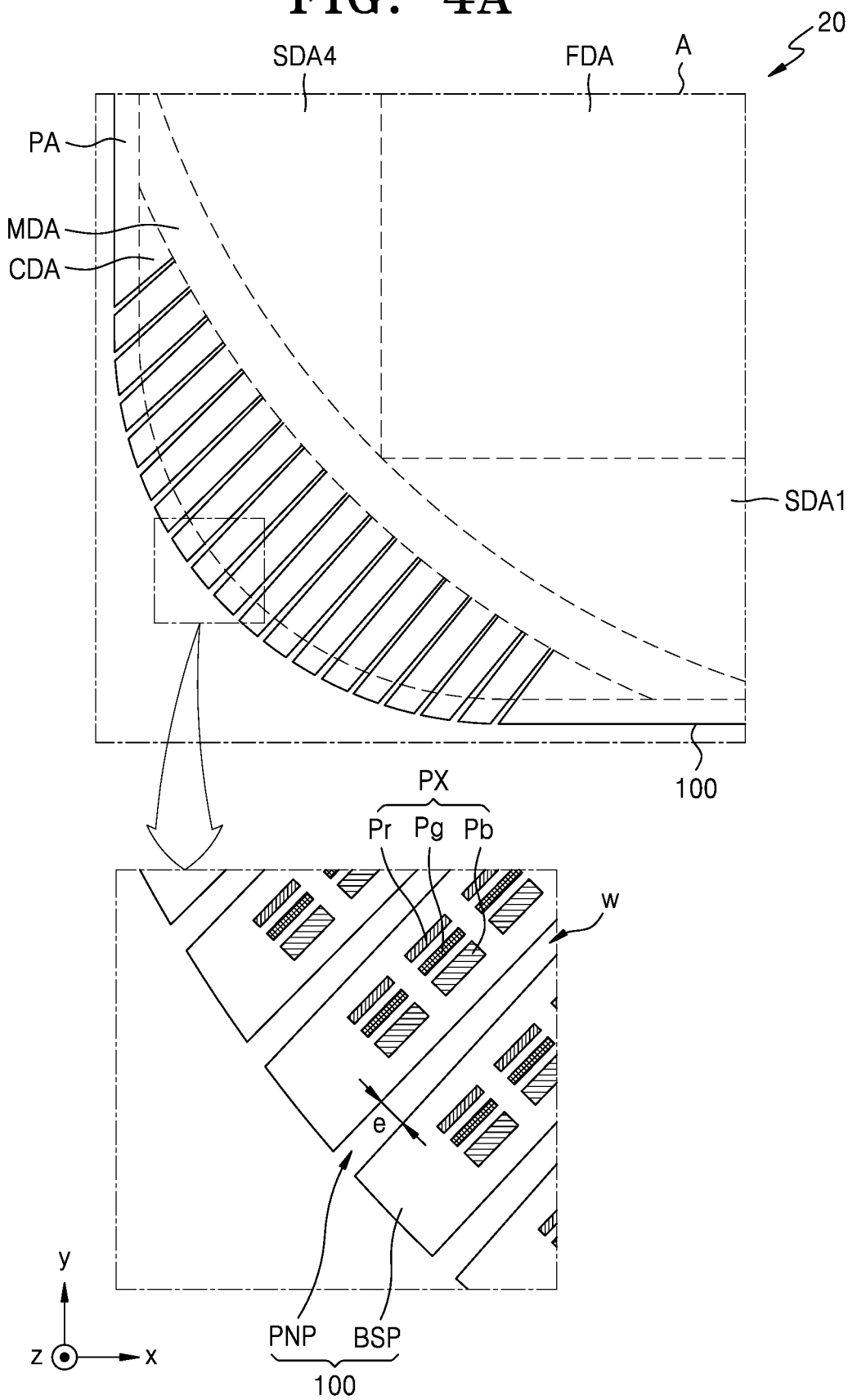
FIGS. 4A and 4B are schematic plan views illustrating an enlarged portion of a display panel according to embodiments.
Figure 4B:
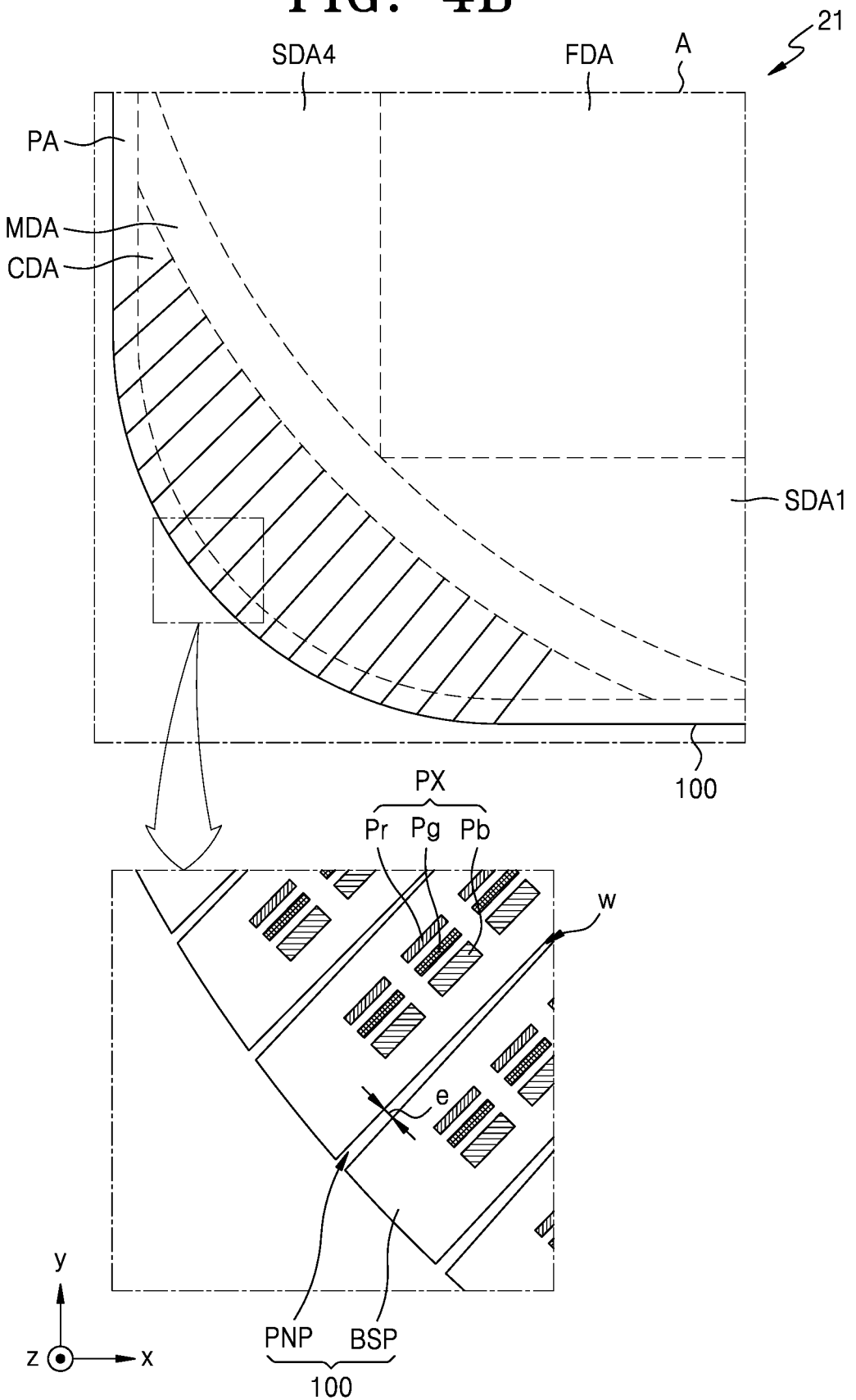

FIGS. 4A and 4B are schematic plan views illustrating an enlarged portion A of a display panel 20 according to embodiments.

Referring to FIG. 4A, a display panel 20 may include a substrate 100 including a plurality of through-portions PNP and a plurality of base portions BSP that are apart from each other by the plurality of through-portions PNP. In an embodiment, the plurality of through-portions PNP and the plurality of base portions BSP of the substrate 100 may be located in a corner display area CDA of the substrate 100, and may extend outwardly away from a main display area FDA of the substrate 100.

For example, each of the plurality of base portions BSP may have a shape extending in an outward direction away from the main display area FDA of the substrate 100. That is, the extension length of each of the plurality of base portions BSP may be greater than the width in a direction crossing an extension direction of each of the plurality of base portions BSP. One end of each of the plurality of base portions BSP may be connected to a portion of the substrate 100, and the other end may form a corner of the substrate 100.

The plurality of base portions BSP may be arranged parallel to each other or may be radially arranged. In an embodiment, when the plurality of base portions BSP are arranged parallel to each other, a distance e between two adjacent base portions BSP may be constant in the extension direction of the base portion BSP. In another embodiment, when the plurality of base portions BSP are radially arranged, the distance e between two adjacent base portions BSP may gradually increase in the extension direction of the base portion BSP. Hereinafter, for convenience of description, a case in which the plurality of base portions BSP are radially arranged as shown in FIG. 4A will be described.

Components, such as a pixel circuit, a light-emitting device, and a signal wiring line, may be disposed on the plurality of base portions BSP. A plurality of pixels PX may be located on each of the plurality of base portions BSP, respectively. In an embodiment, the plurality of pixels PX may include a red sub-pixel Pr, a green sub-pixel Pg, and a blue sub-pixel Pb. The corner display area CDA may be implemented by pixels PX on the plurality of base portions BSP, respectively.

A through-portion PNP may be located between two adjacent base portions BSP among the plurality of base portions BSP. The through-portion PNP may be defined by two adjacent base portions BSP and a portion of the substrate 100 connected to the two base portions BSP. The through-portion PNP may extend in the extension direction of the base portion BSP. The through-portion PNP may pass through the upper and lower surfaces of the display panel 20 and may reduce the weight of the display panel 20. Due to the through-portion PNP, two adjacent base portions BSP among the plurality of base portions BSP may be apart from each other by the distance e. The through-portion PNP may provide a separation region w between two adjacent base portions BSP. That is, each through-portion PNP may overlap the separation region w in a plan view.

Referring to FIG. 4B, when an external force (e.g., a force, such as bending or compression) is applied to the display panel 20, the positions of the plurality of base portions BSP may change, and the shape of the separation region w between the two adjacent base portions BSP may change. Through this, both contraction characteristics and stretching characteristics may be imparted to the display panel 20. For example, as an external force is applied to the base portions BSP, each of the base portions BSP may be stretched in an extension direction, and at the same time, as the area of the separation region w between the two adjacent base portions BSP decreases, a contraction effect may be obtained. Also, in some embodiments, the base portions BSP may bend by different curvatures.

Through the structure of the substrate 100, damage to components arranged in the corner display areas CDA of the substrate 100 may be prevented even when the corner display areas CDA of the substrate 100 bend. Because components may be arranged without damage in the corner display areas CDA of the substrate 100, the pixels PX may be stably formed in the corner display areas CDA. Accordingly, the corner display areas CDA of the display device 1 may be realized, and thus, the display area DA of the display device 1 may be expanded.

Figure 5:
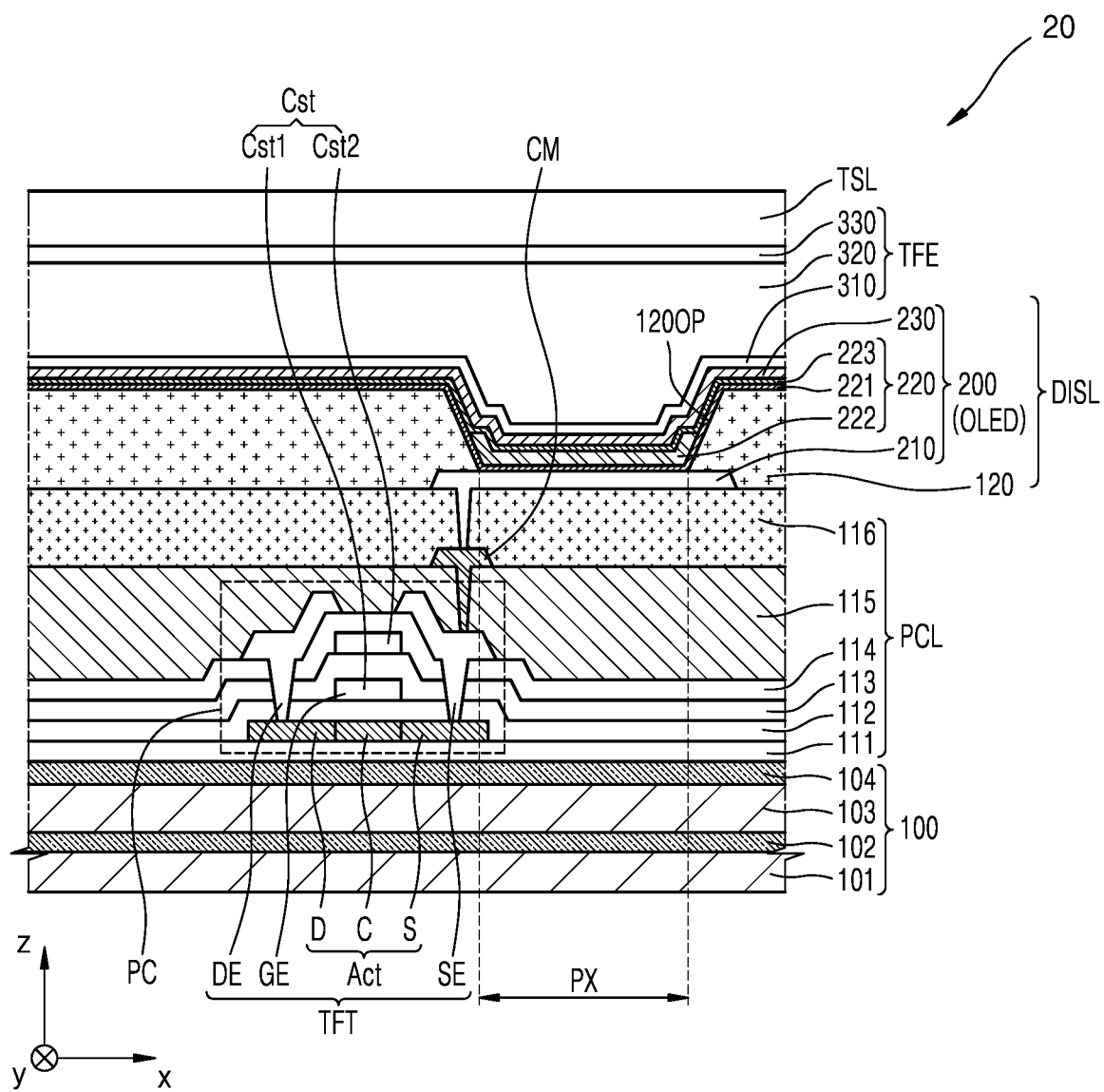
FIG. 5 is a schematic cross-sectional view illustrating a portion of a display panel included in a display device according to embodiments.

FIG. 5 is a schematic cross-sectional view illustrating a portion of a display panel 20 included in a display device 1 according to embodiments.

Referring to FIG. 5, the display panel 20 may include a substrate 100, a pixel circuit layer PCL, a display layer DISL, a thin-film encapsulation layer TFE, and a touch sensing layer TSL.

The substrate 100 may have a multilayer structure including a base layer including polymer resin and an inorganic layer. For example, the substrate 100 may include a base layer including polymer resin and a barrier layer of an inorganic insulating layer. For example, the substrate 100 may include a first base layer 101, a first barrier layer 102, a second base layer 103, and a second barrier layer 104, which are sequentially stacked. Each of the first base layer 101 and the second base layer 103 may include polyimide ("PI"), polyethersulfone ("PES"), polyarylate, polyetherimide ("PEI"), polyethylene napthalate ("PEN"), polyethylene terepthalate ("PET"), polyphenylene sulfide ("PPS"), polycarbonate ("PC"), cellulose triacetate ("TAC"), and/or cellulose acetate propionate ("CAP"). Each of the first barrier layer 102 and the second barrier layer 104 may include an inorganic insulating material including silicon oxide, silicon oxynitride, and/or silicon nitride. The substrate 100 may be flexible.

The pixel circuit layer PCL may be disposed on the substrate 100. The pixel circuit layer PCL may include a pixel circuit PC including a thin-film transistor TFT and a storage capacitor Cst. In addition, the pixel circuit layer PCL may include a buffer layer 111, a first gate insulating layer 112, a second gate insulating layer 113, an interlayer insulating layer 114, a first planarization insulating layer 115, and a second planarization insulating layer 116, which are disposed below and/or above the components of the pixel circuit PC.

The buffer layer 111 may reduce or block penetration of foreign matter, moisture, or external air below the substrate 100, and may provide a flat surface on the substrate 100. The buffer layer 111 may include an inorganic insulating material, such as silicon oxide, silicon oxynitride, and/or silicon nitride, and may have a single layer or multilayer structure including the aforementioned material.

The thin-film transistor TFT on the buffer layer 111 may include a semiconductor layer Act, and the semiconductor layer Act may include polysilicon. Alternatively, the semiconductor layer Act may include amorphous silicon, an oxide semiconductor, or an organic semiconductor. The semiconductor layer Act may include a channel region C, and a drain region D and a source region S disposed on opposite sides of the channel region C, respectively. A gate electrode GE may overlap the channel region C in a plan view.

The gate electrode GE may include a low-resistance metal material. The gate electrode GE may include a conductive material including molybdenum (Mo), aluminum (Al), copper (Cu), titanium (Ti), or the like, and may be formed as a multilayer or single layer including the aforementioned material.

The first gate insulating layer 112 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). In this case, $ZnO_x$ may include zinc oxide (ZnO) and/or zinc peroxide ($ZnO_2$).

The second gate insulating layer 113 may be provided to cover the gate electrode GE. Similar to the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, or $ZnO_x$. In this case, $ZnO_x$ may include ZnO and/or $ZnO_2$.

An upper electrode Cst2 of the storage capacitor Cst may be disposed on the second gate insulating layer 113. The upper electrode Cst2 may overlap the gate electrode GE thereunder in a plan view. In this case, the gate electrode GE and the upper electrode Cst2, which overlap each other with the second gate insulating layer 113 therebetween in a plan view, may form a storage capacitor Cst. That is, the gate electrode GE may function as a lower electrode Cst1 of the storage capacitor Cst.

As described above, the storage capacitor Cst and the thin-film transistor TFT may be formed to overlap each other in a plan view. In some embodiments, the storage capacitor Cst may be formed not to overlap the thin-film transistor TFT in a plan view.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multilayer including the aforementioned material(s).

The interlayer insulating layer 114 may cover the upper electrode Cst2. The interlayer insulating layer 114 may include an inorganic insulating material, such as $SiO_2$, $SiN_x$, SiON, $Al_2O_3$, $TiO_2$, $Ta_2O_5$, $HfO_2$, or $ZnO_x$. In this case, $ZnO_x$ may include ZnO and/or $ZnO_2$. The interlayer insulating layer 114 may include a single layer or multilayer including the aforementioned inorganic insulating material.

A drain electrode DE and a source electrode SE may each be located on the interlayer insulating layer 114. The drain electrode DE and the source electrode SE may be connected to the drain region D and the source region S through contact holes of insulating layers below the drain electrode DE and the source electrode SE, respectively. The drain electrode DE and the source electrode SE may each include a material having good conductivity. The drain electrode DE and the source electrode SE may each include a conductive material including Mo, Al, Cu, Ti, or the like, and may each be formed as a multilayer or single layer including the conductive material. In an embodiment, each of the drain electrode DE and the source electrode SE may have a multilayer structure of Ti/Al/Ti.

The first planarization insulating layer 115 may cover the drain electrode DE and the source electrode SE. The first planarization insulating layer 115 may include an organic insulating material, such as a general general-purpose polymer, such as polymethyl methacrylate ("PMMA") or polystyrene ("PS"), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and/or a blend thereof.

The second planarization insulating layer 116 may be disposed on the first planarization insulating layer 115. The second planarization insulating layer 116 may include the same material as that of the first planarization insulating layer 115, and may include an organic insulating material, such as a general general-purpose polymer, such as PMMA or PS, a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and/or a blend thereof.

The display layer DISL may be disposed on the pixel circuit layer PCL having the structure described above. The display layer DISL may include a light-emitting device 200 and a pixel-defining layer 120. The light-emitting device 200 may include, for example, an organic light-emitting diode OLED, and the organic light-emitting diode OLED may have a stacked structure including a pixel electrode 210, an intermediate layer 220, and an opposite electrode 230. The organic light-emitting diode OLED may emit, for example, red, green, or blue light, or may emit red, green, blue, or white light. The organic light-emitting diode OLED may emit light through an emission area, and the emission area may be defined as a pixel PX.

The pixel electrode 210 may be disposed on the second planarization insulating layer 116. The pixel electrode 210 may be connected to a contact metal CM disposed on the first planarization insulating layer 115 through a contact hole formed in the second planarization insulating layer 116, and may be electrically connected to the thin-film transistor TFT through the contact metal CM.

The pixel electrode 210 may include a conductive oxide, such as indium tin oxide ("ITO"), indium zinc oxide ("IZO"), zinc oxide ("ZnO"), indium oxide ("In$_2$O$_3$"), indium gallium oxide ("IGO"), or aluminum zinc oxide ("AZO"). In another embodiment, the pixel electrode 210 may be a reflective layer including Ag, Mg, Al, Pt, Pd, Au, Ni, Nd, Ir, Cr, or a compound thereof. In another embodiment, the pixel electrode 210 may further include a layer including ITO, IZO, ZnO, and/or In$_2$O$_3$ above or under the reflective layer.

A pixel-defining layer 120 having an opening 1200P exposing a central portion of the pixel electrode 210 may be disposed on the pixel electrode 210. The pixel-defining layer 120 may include an organic insulating material and/or an inorganic insulating material. The opening 1200P may define an emission area of light emitted from the light-emitting device 200. For example, the size/width of the opening 1200P may correspond to the size/width of the emission area. Accordingly, the size and/or width of the pixel PX may depend on the size and/or width of the opening 1200P of the pixel-defining layer 120.

The intermediate layer 220 may include an emission layer 222 formed to correspond to the pixel electrode 210. The emission layer 222 may include a polymer or low molecular weight organic material that emits light of a certain color. Alternatively, the emission layer 222 may include an inorganic light-emitting material or quantum dots.

A first functional layer 221 and a second functional layer 223 may be disposed below and above the emission layer 222, respectively. The first functional layer 221 may include a hole transport layer ("HTL") or include both an HTL and a hole injection layer ("HIL"). The second functional layer 223 may be a component disposed on the emission layer 222, and may include an electron transport layer ("ETL") and/or an electron injection layer ("EIL"). The first functional layer 221 and/or the second functional layer 223 may be a common layer formed to entirely cover the substrate 100, like the opposite electrode 230 to be described below.

The opposite electrode 230 may be disposed on the pixel electrode 210 and may overlap the pixel electrode 210 in a plan view. The opposite electrode 230 may include a conductive material having a low work function. For example, the opposite electrode 230 may include a (semi)transparent layer including Ag, Mg, Al, Pt, Pd, Au, Ni, Nd, Ir, Cr, Li, Ca, and/or an alloy thereof. Alternatively, the opposite electrode 230 may further include a layer, such as ITO, IZO, ZnO, and/or In$_2$O$_3$, on the (semi)transparent layer including the material described above. The opposite electrode 230 may be integrally formed to entirely cover the substrate 100.

The display panel 20 may include a plurality of light-emitting devices 200, and the plurality of light-emitting devices 200 may provide an image by emitting light through the pixels PX. That is, the display area DA (refer to FIGS. 1A and 1B) may be defined by the plurality of light-emitting devices 200.

A thin-film encapsulation layer TFE may be disposed on the opposite electrode 230 of the light-emitting device 200 and may cover the light-emitting devices 200 of the display layer DISL. The thin-film encapsulation layer TFE may include at least one inorganic encapsulation layer and at least one organic encapsulation layer, and in an embodiment, FIG. 5 illustrates an example in which the thin-film encapsulation layer TFE includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include at least one inorganic material selected from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acrylic resin, epoxy-based resin, polyimide, polyethylene, or/and the like. In an embodiment, the organic encapsulation layer 320 may include an acrylate. The organic encapsulation layer 320 may be formed by curing a monomer or applying a polymer. The organic encapsulation layer 320 may be transparent.

A touch sensing layer TSL may be disposed on the thin-film encapsulation layer TFE. In an embodiment, as shown in FIG. 5, the touch sensing layer TSL may be formed directly on the thin-film encapsulation layer TFE. In this case, an adhesive layer may not be between the touch sensing layer TSL and the thin-film encapsulation layer TFE.

The touch sensing layer TSL may acquire coordinate information according to an external input, for example, a touch event. The touch sensing layer TSL may include, for example, a sensing electrode and signal lines connected to the sensing electrode. The touch sensing layer TSL may sense an external input by using a mutual capacitance method or a self-capacitance method.

Although it has been described above that the display device 1 includes an organic light-emitting diode OLED as a light-emitting device, the display device 1 is not limited thereto. In another embodiment, the display device 1 may be a light-emitting display device including an inorganic light-emitting diode, that is, an inorganic light-emitting display device. In another embodiment, the display device 1 may be a quantum dot light-emitting display device. However, for convenience of description, a case in which the display device 1 includes an organic light-emitting diode OLED will be described below.

Figure 6:
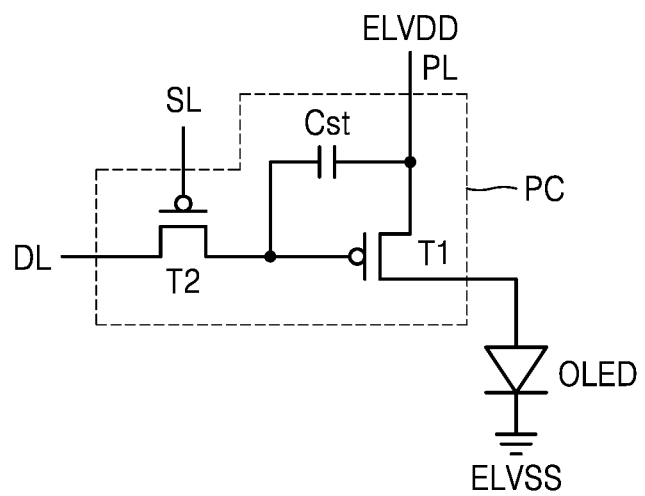
FIG. 6 is an equivalent circuit diagram of a pixel circuit included in a display device according to embodiments.

FIG. 6 is an equivalent circuit diagram of a pixel circuit PC included in a display device 1 according to embodiments.

Referring to FIG. 6, the pixel circuit PC may include a plurality of thin-film transistors TFT (refer to FIG. 5) and a storage capacitor Cst, and may be electrically connected to an organic light-emitting diode OLED. In an embodiment, the pixel circuit PC may include a driving thin-film transistor T1, a switching thin-film transistor T2, and a storage capacitor Cst.

The switching thin-film transistor T2 may be connected to a scan line SL and a data line DL, and may be configured to transfer a data signal input from the data line DL to the driving thin-film transistor T1, based on a scan signal or switching voltage input from the scan line SL. The storage capacitor Cst may be connected to the switching thin-film transistor T2 and a driving voltage line PL, and may store a voltage corresponding to the difference between a voltage received from the switching thin-film transistor T2 and a first power voltage ELVDD supplied to the driving voltage line PL.

The driving thin-film transistor T1 may be connected to the driving voltage line PL and the storage capacitor Cst, and may be configured to control a driving current, which flows from the driving voltage line PL through the organic light-emitting diode OLED, in response to a voltage value stored in the storage capacitor Cst. An opposite electrode (e.g., a cathode) of the organic light-emitting diode OLED may receive a second power voltage ELVSS. The organic light-emitting diode OLED may emit light having a certain luminance according to a driving current.

Although a case where the pixel circuit PC includes two thin-film transistors and one storage capacitor has been described, the disclosure is not limited thereto. In another embodiment, for example, the pixel circuit PC may include three or more thin-film transistors and/or two or more storage capacitors. In an embodiment, the pixel circuit PC may include seven thin-film transistors and one storage capacitor. The number of thin-film transistors and storage capacitors may be variously changed according to the design of the pixel circuit PC. However, hereinafter, for convenience of description, a case in which the pixel circuit PC includes two thin-film transistors and one storage capacitor will be described.

Figure 7:
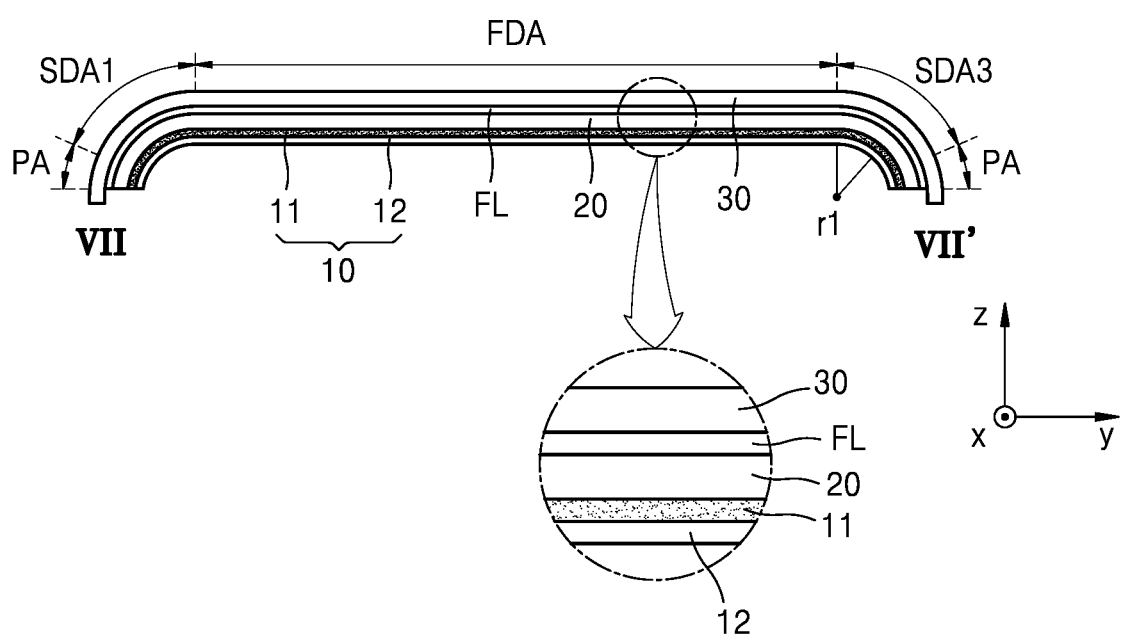
FIG. 7 is a cross-sectional view of a portion of the display device of FIG. 1A or FIG. 1B, taken along line VII-VII' in FIG. 1A or FIG. 1B.
Figure 8:
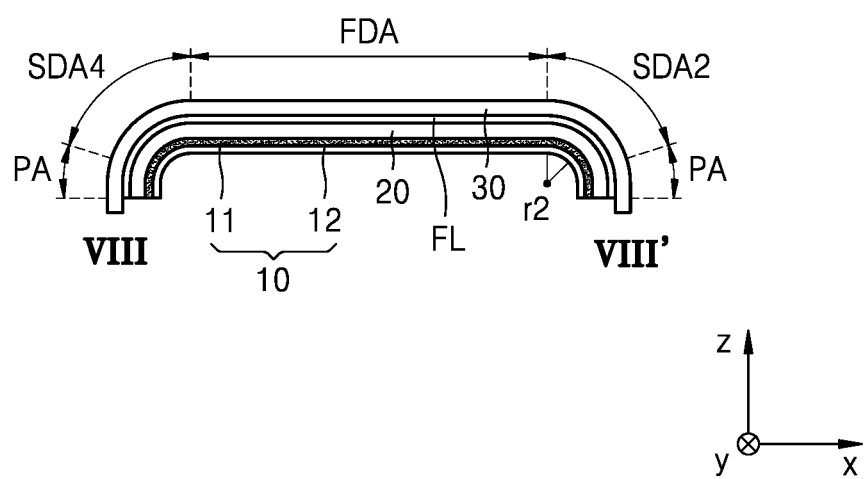
FIG. 8 is a cross-sectional view of a portion of the display device of FIG. 1A or FIG. 1B, taken along line VIII-VIII' in FIG. 1A or FIG. 1B.
Figure 9:
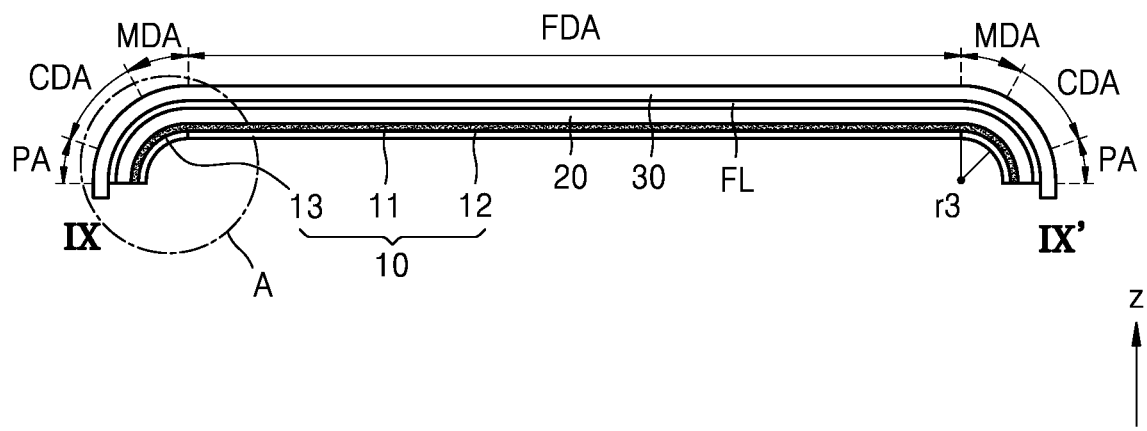
FIG. 9 is a cross-sectional view of a portion of the display device of FIG. 1A or FIG. 1B, taken along line IX-IX' in FIG. 1A or FIG. 1B.

FIG. 7 is a cross-sectional view of a portion of the display device 1 of FIG. 1A or FIG. 1B, taken along line VII-VII' in FIG. 1A or FIG. 1B. FIG. 8 is a cross-sectional view of a portion of the display device 1 of FIG. 1A or FIG. 1B, taken along line VIII-VIII' in FIG. 1A or FIG. 1B. FIG. 9 is a cross-sectional view of a portion of the display device 1 of FIG. 1A or FIG. 1B, taken along line IX-IX' in FIG. 1A or FIG. 1B.

Referring to FIGS. 7 to 9, the display device 1 may include a protective film 10, a display panel 20, and a cover window 30. The protective film 10 may include a first layer 11, a second layer 12, and a third layer 13. In this case, because the display panel 20 and the cover window 30 are the same as or similar to those described above, detailed descriptions thereof will be omitted.

A functional layer FL may be attached to the front surface of the display panel 20 in the form of a film through an adhesive member. As the adhesive member, a general one known in the art may be employed without limitation. For example, the adhesive member may be an optically clear adhesive (OCA) or a PSA.

In an embodiment, the functional layer FL may be an optical function layer that reduces the reflectance of light (external light) incident from the outside toward the display panel 20 and/or improves the color purity of light emitted from the display panel 20. In this case, the functional layer FL may be a polarizing film including a phase retarder and/or a polarizer. The phase retarder may include a $\lambda/2$ phase retarder and/or a $\lambda/4$ phase retarder.

The protective film 10 and the cover window 30 may protect the display panel 20.

The display panel 20 may be disposed under the cover window 30. The display area DA of the display panel 20 may include the main display area FDA and the auxiliary display area SDA, as described with reference to FIG. 1A. In another embodiment, the display area DA of the display panel 20 may include the main display area FDA, the auxiliary display area SDA, the corner display area CDA, and the intermediate display area MDA, as described with reference to FIG. 1B. Hereinafter, for convenience of description, a case, in which the display area DA includes the main display area FDA, the auxiliary display area SDA, the corner display area CDA, and the intermediate display area MDA, will be described in detail.

The first auxiliary display area SDA1 and the third auxiliary display area SDA3 may be connected to the main display area FDA in a second direction (e.g., ±y direction). For example, the first auxiliary display area SDA1 may extend in the −y direction from the main display area FDA, and the third auxiliary display area SDA3 may extend in the +y direction from the main display area FDA. The first auxiliary display area SDA1 may be connected to the first edge SD1 of the main display area FDA, and the third auxiliary display area SDA3 may be connected to the third edge SD3 of the main display area FDA.

Each of the first auxiliary display area SDA1 and the third auxiliary display area SDA3 may have an arbitrary radius of curvature and may bend. For example, the radius of curvature of the first auxiliary display area SDA1 may be different from the radius of curvature of the third auxiliary display area SDA3. As another example, the radius of curvature of the first auxiliary display area SDA1 may be the same as the radius of curvature of the third auxiliary display area SDA3. Hereinafter, a case, in which the first auxiliary display area SDA1 and the third auxiliary display area SDA3 have the same radius of curvature as a first radius of curvature r1, will be described in detail. In addition, because the first auxiliary display area SDA1 and the third auxiliary display area SDA3 are the same as or similar to each other, the first auxiliary display area SDA1 will be mainly described in detail.

The second auxiliary display area SDA2 and the fourth auxiliary display area SDA4 may be connected to the main display area FDA in a first direction (e.g., ±x direction). For example, the second auxiliary display area SDA2 may extend in the +x direction from the main display area FDA, and the fourth auxiliary display area SDA4 may extend in the −x direction from the main display area FDA.

Each of the second auxiliary display area SDA2 and the fourth auxiliary display area SDA4 may have an arbitrary radius of curvature and may bend. For example, the radius of curvature of the second auxiliary display area SDA2 may be different from the radius of curvature of the fourth auxiliary display area SDA4. As another example, the radius of curvature of the second auxiliary display area SDA2 may be the same as the radius of curvature of the fourth auxiliary display area SDA4. Hereinafter, a case, in which the second auxiliary display area SDA2 and the fourth auxiliary display area SDA4 have the same radius of curvature as a second radius of curvature r2, will be described in detail. In addition, because the second auxiliary display area SDA2 and the fourth auxiliary display area SDA4 are the same as or similar to each other, the second auxiliary display area SDA2 will be mainly described in detail.

In an embodiment, the first radius of curvature r1 of the first auxiliary display area SDA1 may be different from the second radius of curvature r2 of the second auxiliary display area SDA2. For example, the first radius of curvature r1 may be less than the second radius of curvature r2. As another example, the first radius of curvature r1 may be greater than the second radius of curvature r2.

In another embodiment, the first radius of curvature r1 of the first auxiliary display area SDA1 may be the same as the second radius of curvature r2 of the second auxiliary display area SDA2. Hereinafter, a case in which the first radius of curvature r1 is greater than the second radius of curvature r2 will be described in detail.

The corner display area CDA and the intermediate display area MDA may extend from a corner of the main display area FDA and bend. That is, the corner display area CDA and the intermediate display area MDA may be corners of the display area DA, as described above, that is, a region where a long side of the display area DA in the second direction (e.g., the ±y direction) meets a short side of the display area DA in the first direction (e.g., the ±x direction).

At least one of the corner display area CDA and the intermediate display area MDA may have a curved shape having a third radius of curvature r3. In this case, the third radius of curvature r3 may be constant in the corner display area CDA and the intermediate display area MDA. In another embodiment, the third radius of curvature r3 of at least one of the corner display area CDA and the intermediate display area MDA may be plural. Each of the corner display area CDA and the intermediate display area MDA may have a plurality of third radii of curvature r3. In other words, the third radius of curvature r3 of the corner display area CDA and the intermediate display area MDA may vary. For example, the plurality of third radii of curvature r3 of the corner display area CDA and the intermediate display area MDA may correspond to arbitrary radii of curvature, respectively, within a vector sum (r1+r2) of the first radius of curvature r1 of the first auxiliary display area SDA1 and the second radius of curvature r2 of the second auxiliary display area SDA2. In other words, the third radius of curvature r3 may vary within the vector sum (r1+r2) of the first radius of curvature r1 and the second radius of curvature r2.

The display device 1 may be manufactured by sequentially attaching the display panel 20 and the protective film 10 to the cover window 30 bent with a preset radius of curvature. Accordingly, although it has been described that the display panel 20 bends with the first radius of curvature r1, the second radius of curvature r2, and the third radius of curvature r3, the same may also apply to the cover window 30 and the protective film 10.

The protective film 10 may be disposed under the display panel 20. The protective film 10 may be disposed on the rear surface (e.g., −z direction) of the display panel 20. The protective film 10 may include a first layer 11, a second layer 12, and a third layer 13, and may be attached to a lower portion of the display panel 20 through the first layer 11 including an adhesive layer.

In an embodiment, the second layer 12 of the protective film 10 may at least partially expose a portion of the first layer 11 of the protective film 10 corresponding to the corner display area CDA of the display panel 20. In another embodiment, the second layer 12 of the protective film 10 may at least partially expose a portion of the first layer 11 of the protective film 10 corresponding to the corner display area CDA and the intermediate display area MDA of the display panel 20. A portion of the protective film 10 corresponding to the corner display area CDA of the display panel 20 may correspond to a corner area CA of the protective film 10 shown in FIG. 10A, which will be described later. The second layer 12 may expose at least a portion of the corner area CA of the first layer 11.

The third layer 13 may shield the corner area CA of the first layer 11 disposed on the second layer 12. In an embodiment, the third layer 13 may be arranged in an area of the first layer 11 where the second layer 12 is not arranged. In this case, the third layer 13 may shield at least a portion of the corner area CA.

Figure 10A:
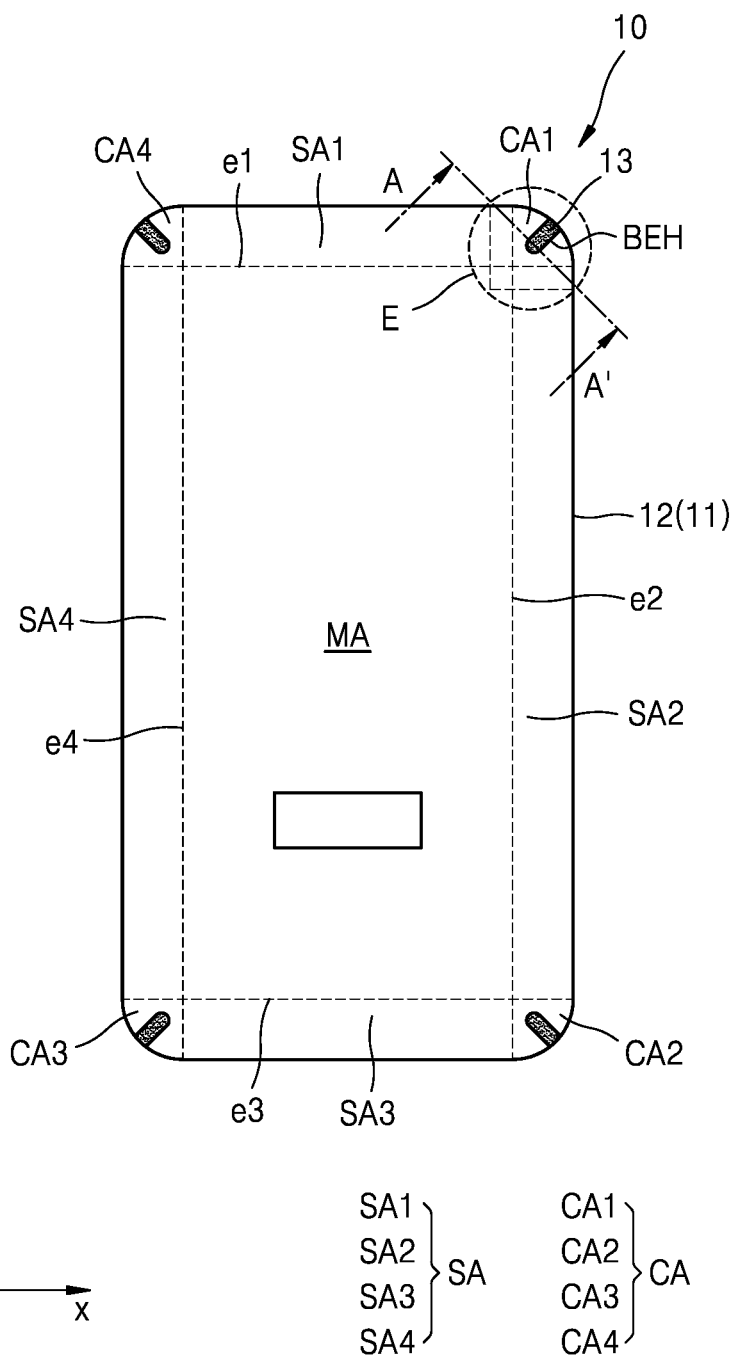
FIG. 10A is a schematic plan view illustrating a protective film according to an embodiment.
Figure 10B:
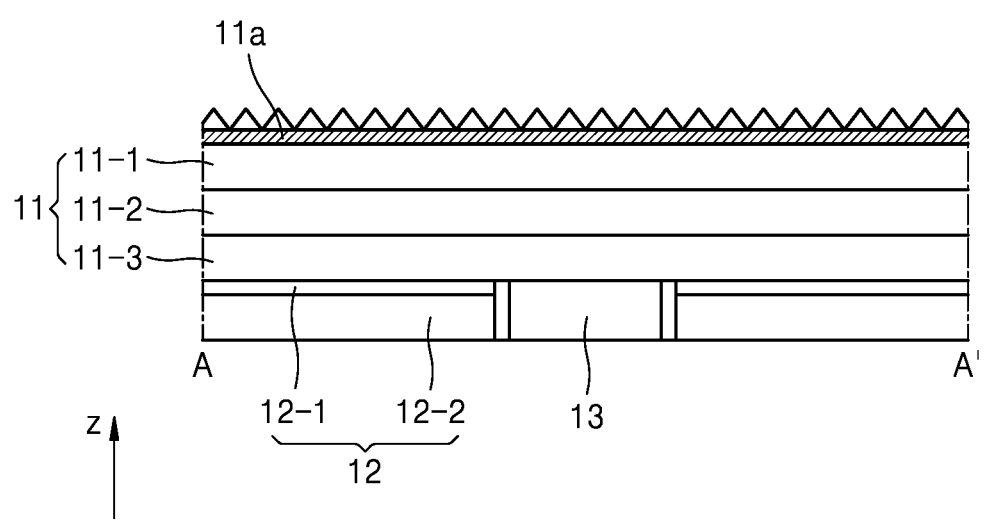
FIG. 10B is a cross-sectional view of the protective film of FIG. 10A taken along line A-A' in FIG. 10A.

FIG. 10A is a schematic plan view illustrating a protective film 10 according to an embodiment. FIG. 10B is a cross-sectional view of the protective film 10 of FIG. 10A taken along line A-A' of FIG. 10A.

Referring to FIGS. 10A and 10B, the protective film 10 may include a middle area MA, a side area SA, and a corner area CA.

The middle area MA corresponds to the central portion of the protective film 10. As shown in FIG. 10A, the middle area MA may have a rectangular shape when viewed from a direction (e.g., z direction) perpendicular to the protective film 10 (i.e., in a plan view).

The side area SA may be connected to an edge of the middle area MA. The side area SA may extend from the edge of the middle area MA. For example, a first side area SA1 may be connected to a first edge e1 of the middle area MA, a second side area SA2 may be connected to a second edge e2 of the middle area MA, a third side area SA3 may be connected to a third edge e3 of the middle area MA, and a fourth side area SA4 may be connected to a fourth edge e4 of the middle area MA. In this case, as shown in FIG. the first edge e1 and the second edge e2 may intersect each other, the first edge e1 and the third edge e3 may be parallel to each other, and the second edge e2 and the fourth edge e4 may be parallel to each other.

The corner area CA may be located at a corner of the protective film 10. The corner area CA may connect with the side area SA. For example, a first corner area CA1 may connect the first side area SA1 to the second side area SA2, a second corner area CA2 may connect the second side area SA2 to the third side area SA3, a third corner area CA3 may connect the third side area SA3 to the fourth side area SA4, and a fourth corner area CA4 may connect the first side area SA1 to the fourth side area SA4.

In an embodiment, as shown in FIG. 10A, the edge of the corner area CA may be convex. The corner area CA may include a curved line at the edge thereof and a straight line in contact with the side area SA. The corner area CA may have a sectoral shape (i.e., fan shape). A planar shape of the protective film 10 may be a rounded rectangle.

In the above case, in an embodiment, at least a portion of the corner area CA may be removed or cut off. For example, a cutout groove BEH may be provided in at least a portion of a second layer 12 in the corner area CA. The shape of the cutout groove BEH may vary. For example, the cutout groove BEH may be formed in a straight line and may have a round end. Also, the cutout groove BEH may have a triangular shape. In another embodiment, the cutout groove BEH may have a polygonal shape, such as a quadrangle.

In another embodiment, the cutout groove BEH may be formed in a side area SA adjacent to the corner area CA in addition to the corner area CA. The cutout groove BEH may be formed in a boundary portion between the corner area CA and the side area SA, or may be formed in a side area SA adjacent to the boundary portion between the corner area CA and the side area SA.

The cutout groove BEH as described above may be formed in each corner area CA. For example, the cutout groove BEH may be formed in the first corner area CA1, the second corner area CA2, the third corner area CA3, and the fourth corner area CA4.

A third layer 13 described above may be disposed on the cutout groove BEH. In this case, the third layer 13 may be arranged to be inserted into the cutout groove BEH when viewed from the rear surface of the display device 1 (i.e., in a plan view). In this case, the edge of the third layer 13 may be arranged to completely contact the edge of the cutout groove BEH or arranged to be apart from the edge of the cutout groove BEH.

Although it is illustrated in FIG. 10A that one cutout groove BEH is provided in the corner area CA, the disclosure is not limited thereto, and in another embodiment, a plurality of cutout grooves BEH may be provided. When a plurality of cutout grooves BEH are provided, in an embodiment, a plurality of cutout grooves BEH may be provided in the corner area CA. In another embodiment, some of the plurality of cutout grooves BEH may be arranged in the corner area CA, and some other of the plurality of cutout grooves BEH may be arranged in the side area SA.

When a plurality of cutout grooves BEH are arranged, each third layer 13 may be arranged to correspond to each cutout groove BEH, and thus, one third layer 13 may shield one cutout groove BEH.

In addition, in the above case, the third layer 13 may be arranged in various shapes. For example, the third layer 13 may be arranged only in the corner area CA. In another embodiment, the third layer 13 may be arranged to shield the corner area CA and the side area SA adjacent to the corner area CA. In another embodiment, the third layer 13 may be arranged to shield the corner area CA, the side area SA adjacent to the corner area CA, and the main area MA.

Hereinafter, the shape of the third layer 13 arranged in the first corner area CA1 will be described in detail.

The first layer 11 and the second layer 12 may each include at least one of a light-absorbing member, a buffering member, a heat-dissipating member, and a light-blocking member. For example, the first layer 11 may include a buffer member and a light-blocking member, and the second layer 12 may include a heat-dissipating member including a metal.

An adhesive may be placed between the first layer 11 and the second layer 12. For example, at least one of an optical clear resin ("OCR"), an OCA, and a PSA may be placed between the first layer 11 and the second layer 12.

The first layer 11 may include a first functional layer 11-1, a second functional layer 11-2, and a third functional layer 11-3, and the second layer 12 may include a fourth functional layer 12-1 and a fifth functional layer 12-2.

The first functional layer 11-1 may have a light-blocking function. The first functional layer 11-1 may include at least one of a light-absorbing member for absorbing light incident from the outside, and a light-blocking member for blocking light incident from the outside.

In an embodiment, the first functional layer 11-1 may be black. The first functional layer 11-1 may include at least one of a black pigment, a black dye, and black particles. For example, the first functional layer 11-1 may include Cr, $CrO_x$, $Cr/CrO_x$, $Cr/CrO_x/CrN_y$, resin (carbon pigment or RGB mixed pigment), graphite, Non-Cr-based pigment, lactam-based pigment, or perylene-based pigment. The first functional layer 11-1 may include a black organic pigment, and the black organic pigment may include at least one selected from the group consisting of aniline black, lactam black, and perylene black. Alternatively, the first functional layer 11-1 may be formed by coating a material such as carbon or chromium.

The first functional layer 11-1 may have an adhesive function of attaching the protective film 10 to the rear surface of the display panel 20 (refer to FIGS. 7 to 9). The first functional layer 11-1 may include an embossed adhesive layer 11a. The material of the embossed adhesive layer 11a is not particularly limited, and an adhesive material well known to those skilled in the art may be used. For example, various polymer resins may be used as the material of the embossed adhesive layer 11a.

The second functional layer 11-2 may function as a base film for forming the first functional layer 11-1. The second functional layer 11-2 may include silicon or polyethylene terephthalate (PET). When the second functional layer 11-2 includes silicon, the stretching characteristics of the second functional layer 11-2 may further increase.

In an embodiment, the second functional layer 11-2 may be black. The second functional layer 11-2 may include at least one of a black pigment, a black dye, and black particles. For example, the second functional layer 11-2 may include Cr, $CrO_x$, $Cr/CrO_x$, $Cr/CrO_x/CrN_y$, resin (carbon pigment or RGB mixed pigment), graphite, Non-Cr-based pigment, lactam-based pigment, or perylene-based pigment. The second functional layer 11-2 may include a black organic pigment, and the black organic pigment may include at least one selected from the group consisting of aniline black, lactam black, and perylene black. Alternatively, the second functional layer 11-2 may be formed by coating a material such as carbon or chromium.

The third functional layer 11-3 may have a cushion function. The third functional layer 11-3 may include a buffer member for absorbing an external shock. The buffer member may include a single layer or a plurality of layers. For example, the buffer member may include polymer resin, such as polyurethane, polycarbonate, polypropylene, or polyethylene, or may include a material having elasticity, such as rubber, a urethane-based material, or a sponge formed by foam-molding an acrylic-based material. The buffer member may be a cushion layer.

The third functional layer 11-3 may be a synthetic resin foam including a matrix member and a plurality of pores. The matrix member may include a flexible material. For example, the matrix member may include a synthetic resin. The pores may easily absorb an impact applied to the display panel 20. The pores may be defined as the third functional layer 11-3 has a porous structure. Accordingly, the pores may be dispersed in the matrix member. The pores may allow the third functional layer 11-3 to be easily deformed. Accordingly, the elasticity of the third functional layer 11-3 may be improved to thereby improve the impact resistance of the protective film 10.

Although not shown in FIG. 10B, an adhesive may be placed between the second functional layer 11-2 and the third functional layer 11-3. For example, at least one of an OCR, an OCA, and a PSA may be placed between the second functional layer 11-2 and the third functional layer 11-3.

The fourth functional layer 12-1 may include a synthetic resin film. The fourth functional layer 12-1 may include a thermosetting resin. The fourth functional layer 12-1 may include at least one of a polyimide-based resin, acrylic resin, a methacrylic resin, a polyisoprene, a vinyl-based resin, epoxy-based resin, a urethane-based resin, a cellulose-based resin, a siloxane-based resin, a polyamide-based resin, and a perylene-based resin.

Although not shown in FIG. 10B, an adhesive may be placed between the third functional layer 11-3 and the fourth functional layer 12-1. For example, at least one of an OCR, an OCA, and a PSA may be placed between the third functional layer 11-3 and the fourth functional layer 12-1.

The fifth functional layer 12-2 may have a function of shielding electromagnetic interference ("EMI") and/or a function of dissipating heat. The fifth functional layer 12-2 may include a heat-dissipating member for efficiently dissipating heat from the display panel 20. For example, the fifth functional layer 12-2 may include a metal material having high thermal conductivity, such as copper, nickel, ferrite, silver, or aluminum.

Although not shown in FIG. 10B, an adhesive may be placed between the fourth functional layer 12-1 and the fifth functional layer 12-2. For example, at least one of an OCR, an OCA, and a PSA may be placed between the fourth functional layer 12-1 and the fifth functional layer 12-2.

In an embodiment, the fourth functional layer 12-1 and the fifth functional layer 12-2 may expose at least a portion of the third functional layer 11-3 corresponding to the first corner area CA1, and may cover another portion of the third functional layer 11-3 corresponding to the first side area SA1 and the second side area SA2. When at least portions of the fourth and fifth functional layers 12-1 and 12-2 having low stretching characteristics are removed corresponding to the first corner area CA1, the stretching characteristics of the first corner area CA1 of the protective film 10 may be improved. In other words, when an external force is applied to the protective film 10, the first corner area CA1 of the protective film 10 may be easily deformed. As the first corner area CA1 of the protective film 10 is easily deformed, wrinkling may not occur when the first corner area CA1 of the protective film 10 bends with a preset radius of curvature. Although the first corner area CA1 has been described, the same may also apply to the second corner area CA2, the third corner area CA3, and the fourth corner area CA4.

As described above, the third layer 13 may be arranged in a region where the second layer 12 is removed. In this case, the third layer 13 may include a shape memory alloy. Accordingly, the third layer 13 may change to an initial shape of the third layer 13 when heat is applied thereto. For example, the third layer 13 may change from a flat shape to a round shape or have a variable length when heat is applied thereto. Alternatively, when heat is applied to the third layer 13, the planar area of the third layer 13 may vary.

The thickness of the third layer 13 may be substantially equal to the thickness of the second layer 12. In this case, the planar edge of the third layer 13 may be in contact with or apart from the planar edge of the second layer 12.

In the above case, when a certain temperature is reached or heat is applied to the third layer 13, the shape of the third layer 13 may be changed to a memorized shape. For example, when a certain temperature is reached or heat is applied to the third layer 13, the third layer 13 may be round and changed into a three-dimensional shape to correspond to each corner area CA, as shown in FIG. 2. Accordingly, the protective film may have a three-dimensional shape as shown in FIG. 2. Alternatively, when a certain temperature is reached or heat is applied to the third layer 13, the planar area of the third layer 13 may be reduced and the corner areas CA of the protective film 10 on opposite sides of the third layer 13 may be adjacent to each other, and thus, the corner areas CA of the protective film 10 may be formed to be round. In this case, the third layer 13 may have a curved shape from the edge of the protective film 10.

FIGS. 11A to 11I are schematic enlarged plan views illustrating a portion E of a protective film 10 according to embodiments.

Figure 11A:
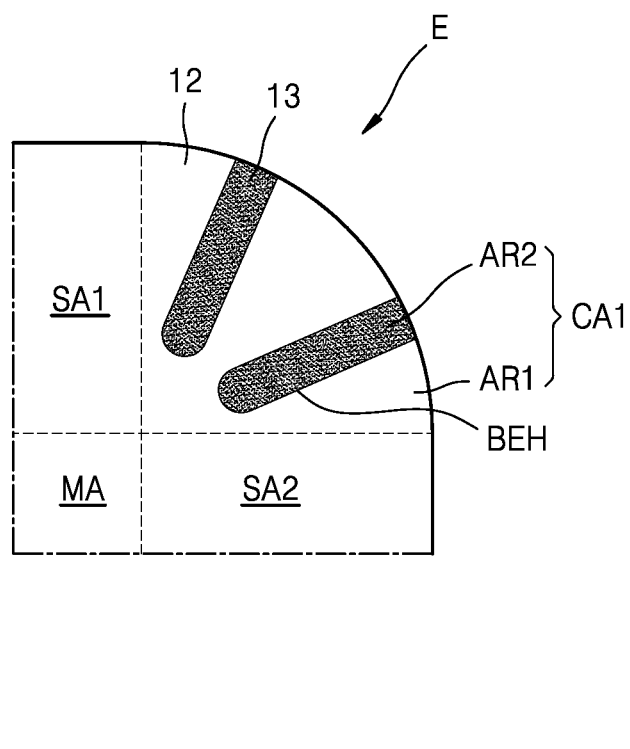
FIGS. 11A to 11I are schematic enlarged plan views illustrating a portion of a protective film according to embodiments.

Referring to FIG. 11A, a plurality of cutout grooves BEH may be arranged in a first corner area CA1. In this case, the plurality of cutout grooves BEH may define a second area AR2 in which the first layer 11 is exposed to the outside. In this case, the first corner area CA1 may include a first area AR1 and a second area AR2, and the first area AR1 is located between adjacent second areas AR2, between the second area AR2 and a first side area SA1, or between the second area AR2 and a second side area SA2. However, hereinafter, for convenience of description, a case in which there are two second areas AR2 will be described in detail.

In the above case, the third layer 13 may shield each of the second areas AR2 that are different from each other.

Third layers 13 may be arranged to be apart from each other to shield the second areas AR2 that are apart from each other. In this case, when the temperature applied to the third layer 13 reaches a certain temperature or when heat is applied to the third layer 13, the shape of the third layer 13 may be changed to a memorized shape, as described above. Accordingly, when the first corner area CA of the protective film 10 is round, the third layer 13 may help the first corner area CA1 of the protective film 10 to have a preset shape without interfering with the deformation of the first corner area CA1. Although this phenomenon is not shown in the drawings, the same may be performed in other corner areas of the protective film 10.

Figure 11B:
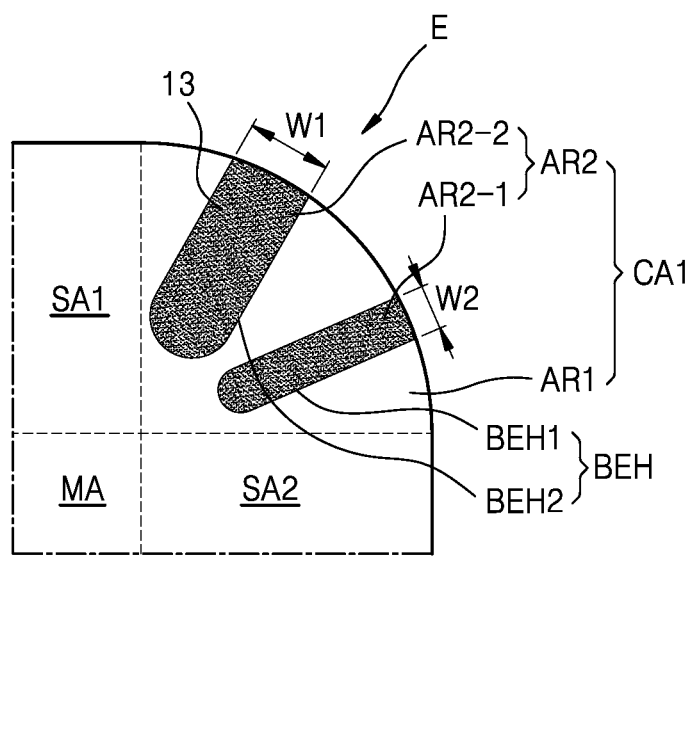

Referring to FIG. 11B, the protective film 10 may include a plurality of cutout grooves BEH. For example, the plurality of cutout grooves BEH may include a first cutout groove BEH1 and a second cutout groove BEH2. In this case, the first cutout groove BEH1 and the second cutout groove BEH2 may be defined as a second-first area AR2-1 and a second-second area AR2-2 arranged in different areas. In this case, the second-first area AR2-1 and the second-second area AR2-2 may each be an area from which the second layer 12 of the protective film 10 is removed.

The first cutout groove BEH1 and the second cutout groove BEH2 may have different shapes or different sizes. For example, when the shapes of the first cutout groove BEH1 and the second cutout groove BEH2 are identical to each other, a first width W1 (e.g., a width measured in a diagonal direction of the x-y axis of FIG. 11B) of the second cutout groove BEH2 may be different from a second width W2 of the first cutout groove BEH1. That is, one of the first width W1 and the second width W2 may be greater than the other one of the first width W1 and the second width W2.

In another embodiment, the first cutout groove BEH1 and the second cutout groove BEH2 may have different shapes from each other. For example, the first cutout groove BEH1 may have a shape similar to a shape of cutout groove BEH of FIG. 11C, which will be described later, and the second cutout groove BEH2 may have the same shape as that shown in FIG. 11B.

In another embodiment, although not shown in the drawings, the first cutout groove BEH1 and the second cutout groove BEH2 may have different lengths. For example, the length of one of the first cutout groove BEH1 and the second cutout groove BEH2 may be less than the length of the other one of the first cutout groove BEH1 and the second cutout groove BEH2.

In the above case, each of the third layers 13 may be arranged to shield the first cutout groove BEH1 and the second cutout groove BEH2. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Figure 11C:
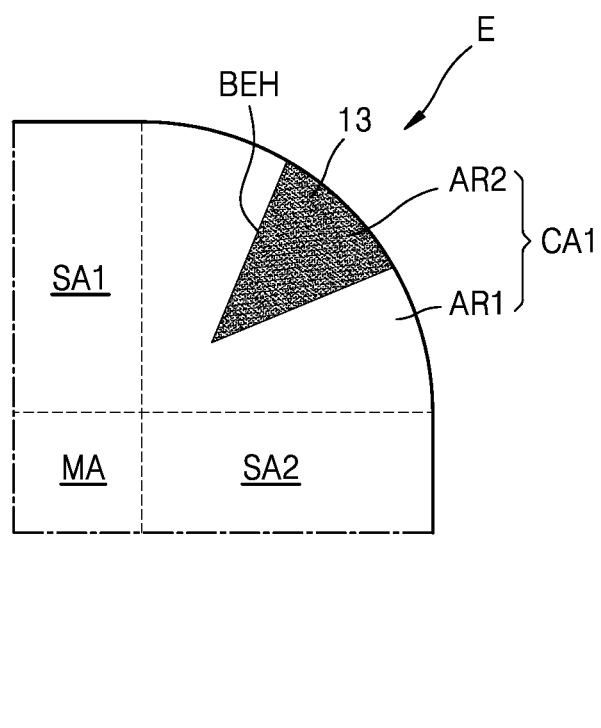

Referring to FIG. 11C, the first corner area CA1 of the protective film 10 (refer to FIG. 10A) may include a first area AR1 and a second area AR2. The protective film 10 may include a first layer 11, and a second layer 12 and a third layer 13 on the first layer 11, as shown in FIG. 10B.

In an embodiment, the second layer 12 may cover a middle area MA of the first layer 11, a first side area SA1, a second side area SA2, and the first area AR1 of the first corner area CA1, and may expose the second area AR2 of the first corner area CA1 of the first layer 11.

When the second layer 12 having lower stretching characteristics than the first layer 11 is partially removed corresponding to the second area AR2 of the first corner area CA1, the stretching characteristics of the first corner area CA1 of the protective film 10 may be improved, and thus, the first corner area CA1 may be easily deformed. Because the first corner area CA1 of the protective film 10 is easily deformed, when the first corner area CA1 is deformed to have a certain curvature, the first corner area CA1 may not be wrinkled.

In an embodiment, as shown in FIG. 11C, the second area AR2 may be apart from the first side area SA1 and the second side area SA2. The first area AR1 may surround at least a portion of the second area AR2.

In FIG. 11C, the planar shape of the second area AR2 is illustrated as a sectoral shape. However, in another embodiment, the second area AR2 may have various planar shapes, such as a circle, an oval, a polygon such as a quadrangle, a star shape, and a diamond shape.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4, shown in FIG. 10A.

The third layer 13 may be arranged in the second area AR2 as described above. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Figure 11D:
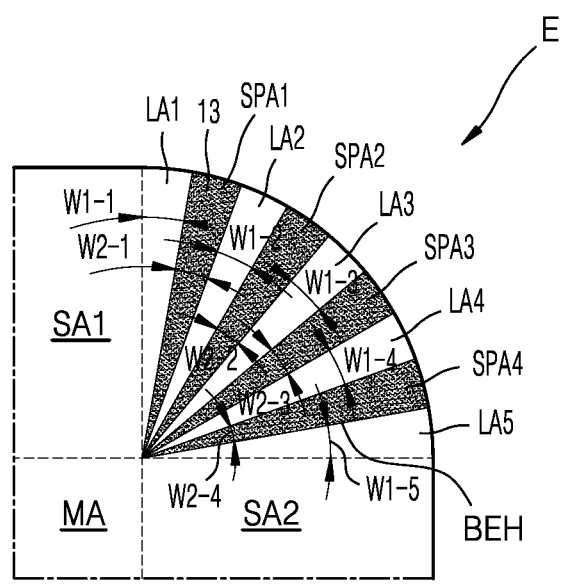

Referring to FIG. 11D, the first corner area CA1 of the protective film 10 (refer to FIG. 10A) may include a first area AR1 (refer to FIG. 11C) and a second area AR2 (refer to FIG. 11C).

The first area AR1 may include a first line area LA1, a second line area LA2, a third line area LA3, a fourth line area LA4, and a fifth line area LA5. The first line area LA1, the second line area LA2, the third line area LA3, the fourth line area LA4, and the fifth line area LA5 may extend in a first direction and may be arranged in a second direction. For example, the first corner area CA1 may have a sectoral shape in a plan view. In this case, the first direction may be a radial direction, and the second direction may be a circumferential direction. The first line area LA1, the second line area LA2, the third line area LA3, the fourth line area LA4, and the fifth line area LA5 may extend in a radial direction and may be arranged in a circumferential direction. In this case, the first line area LA1, the second line area LA2, the third line area LA3, the fourth line area LA4, and the fifth line area LA5 are sequentially arranged in a direction from the first side area SA1 to the second side area SA2. The first line area LA1, the second line area LA2, the third line area LA3, the fourth line area LA4, and the fifth line area LA5 may be arranged to be separated from each other.

The first line area LA1, the second line area LA2, the third line area LA3, the fourth line area LA4, and the fifth line area LA5 may have the same shape. For example, the first line area LA1, the second line area LA2, the third line area LA3, the fourth line area LA4, and the fifth line area LA5 may have sectoral shapes.

In the above case, a first-first width W1-1 of the first line area LA1, a first-second width W1-2 of the second line area LA2, a first-third width W1-3 of the third line area LA3, a first-fourth width W1-4 of the fourth line area LA4, and a first-fifth width W1-5 of the fifth line area LA5 may vary. In an embodiment, the first-first width W1-1 of the first line area LA1, the first-second width W1-2 of the second line area LA2, the first-third width W1-3 of the third line area LA3, the first-fourth width W1-4 of the fourth line area LA4, and the first-fifth width W1-5 of the fifth line area LA5, which pass through the same arc, may be equal to one another.

In another embodiment, one of the first-first width W1-1 of the first line area LA1, the first-second width W1-2 of the second line area LA2, the first-third width W1-3 of the third line area LA3, the first-fourth width W1-4 of the fourth line area LA4, and the first-fifth width W1-5 of the fifth line area LA5, which pass through the same arc, may be greater or less than another one of the first-first width W1-1 of the first line area LA1, the first-second width W1-2 of the second line area LA2, the first-third width W1-3 of the third line area LA3, the first-fourth width W1-4 of the fourth line area LA4, and the first-fifth width W1-5 of the fifth line area LA5. For example, the first-third width W1-3 may be the greatest, and the first-second width W1-2 and the first-first width W1-1 may gradually decrease. Also, the first-fourth width W1-4 and the first-fifth width W1-5 may gradually decrease based on the first-third width W1-3. In this case, the first-fourth width W1-4 and the first-second width W1-2 may be equal to each other, and the first-first width W1-1 and the first-fifth width W1-5 may be equal to each other. In another embodiment, the first-first width W1-1 may be the greatest, and the first-second width W1-2, the first-third width W1-3, the first-fourth width W1-4, and the first-fifth width W1-5 may sequentially decrease in this order. In another embodiment, the first-fifth width W1-5 may be the greatest, and the first-fourth width W1-4, the first-third width W1-3, the first-second width W1-2, and the first-first width W1-1 may sequentially decrease in this order. In another embodiment, the first-first width W1-1, the first-second width W1-2, the first-third width W1-3, the first-fourth width W1-4, and the first-fifth width W1-5 may be different from one another, and the widths may be various ones.

In addition to the above cases, the shape of one of the first line area LA1, the second line area LA2, the third line area LA3, the fourth line area LA4, and the fifth line area LA5 may be different from the shape of the other one of the first line area LA1, the second line area LA2, the third line area LA3, the fourth line area LA4, and the fifth line area LA5. For example, the shape of one of the first line area LA1, the second line area LA2, the third line area LA3, the fourth line area LA4, and the fifth line area LA5 may be the same as or similar to the shape of the first area AR1 shown in FIG. 10A, 11A, or 11B, and the shape of the other one of the first line area LA1, the second line area LA2, the third line area LA3, the fourth line area LA4, and the fifth line area LA5 may be the same as or similar to the shape of the first area AR1 shown in FIG. 11C or 11D.

The second area AR2 may include a first space area SPA1, a second space area SPA2, a third space area SPA3, and a fourth space area SPA4. The first space area SPA1, the second space area SPA2, the third space area SPA3, and the fourth space area SPA4 may extend in the first direction and may be arranged in the second direction. For example, the first space area SPA1, the second space area SPA2, the third space area SPA3, and the fourth space area SPA4 may extend in a radial direction and may be arranged in a circumferential direction.

In an embodiment, the first line area LA1, the second line area LA2, the third line area LA3, the fourth line area LA4, and the fifth line area LA5 and the first space area SPA1, the second space area SPA2, the third space area SPA3, and the fourth space area SPA4 may be alternately arranged in the second direction. For example, as shown in FIG. 11D, the first line area LA1, the second line area LA2, the third line area LA3, the fourth line area LA4, and the fifth line area LA5 and the first space area SPA1, the second space area SPA2, the third space area SPA3, and the fourth space area SPA4 may be alternately arranged in the circumferential direction.

In the above case, the first space area SPA1, the second space area SPA2, the third space area SPA3, and the fourth space area SPA4 may arranged to be apart from each other from the first side area SA1 to the second side area SA2. In this case, each of the first space area SPA1, the second space area SPA2, the third space area SPA3, and the fourth space area SPA4 may define a cutout groove BEH.

In this case, the shapes of the first space area SPA1, the second space area SPA2, the third space area SPA3, and the fourth space area SPA4 may be the same or different from each other. For example, the shape of each of the first space area SPA1, the second space area SPA2, the third space area SPA3, and the fourth space area SPA4 may be the same as or similar to the shape of the second area AR2 shown in FIGS. 10A, 11A, 11B, and 11C. However, hereinafter, for convenience of description, a case, in which the shape of each of the first space area SPA1, the second space area SPA2, the third space area SPA3, and the fourth space area SPA4 is a sectoral shape as shown in FIG. 11D, will be described in detail.

Second widths W2 of the first space area SPA1, the second space area SPA2, the third space area SPA3, and the fourth space area SPA4 arranged in the same arc may be equal to or different from one another. For example, the second-first width W2-1 of the first space area SPA1, the second-second width W2-2 of the second space area SPA2, the second-third width W2-3 of the third space area SPA3, and the second-fourth width W2-4 of the fourth space area SPA4 may be equal to or different from one another. In this case, the relationship among the second-first width W2-1, the second-second width W2-2, the second-third width W2-3, and the second-fourth width W2-4 may be the same as or similar to the relationship among the first-first width W1-1, the first-second width W1-2, the first-third width W1-3, the first-fourth width W1-4, and the first-fifth width W1-5.

In the above case, a first width W1 of each of the first line area LA1, the second line area LA2, the third line area LA3, the fourth line area LA4, and the fifth line area LA5 in the second direction may gradually increase in the first direction, and a second width W2 of each of the first space area SPA1, the second space area SPA2, the third space area SPA3, and the fourth space area SPA4 in the second direction may gradually increase in the first direction. For example, as shown in FIG. 11D, the first width W1 of each of the first line area LA1, the second line area LA2, the third line area LA3, the fourth line area LA4, and the fifth line area LA5 in the circumferential direction may gradually increase in the radial direction. The second width W2 of each of the first space area SPA1, the second space area SPA2, the third space area SPA3, and the fourth space area SPA4 in the circumferential direction may gradually increase in the radial direction.

As described above, the second layer 12 of the protective film 10 may cover the first area AR1 of the first corner area CA1 of the first layer 11, and may expose the second area AR2 of the first corner area CA1 of the first layer 11. The second layer 12 of the protective film 10 may cover the first line area LA1, the second line area LA2, the third line area LA3, the fourth line area LA4, and the fifth line area LA5 of the first layer 11, and may expose the first space area SPA1, the second space area SPA2, the third space area SPA3, and the fourth space area SPA4.

When the second layer 12 having lower stretching characteristics than that of the first layer 11 is partially removed corresponding to the first space area SPA1, the second space area SPA2, the third space area SPA3, and the fourth space area SPA4 of the first corner area CA1, the stretching characteristics of the first corner area CA1 of the protective film 10 may be improved, and thus, the first corner area CA1 may be easily deformed. Because the first corner area CA1 of the protective film 10 is easily deformed, when the first corner area CA1 is deformed to have a certain curvature, the first corner area CA1 may not be wrinkled.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4.

Each of the first space area SPA1, the second space area SPA2, the third space area SPA3, and the fourth space area SPA4 as described above may be defined as an edge of the cutout groove BEH. In this case, each of the first space area SPA1, the second space area SPA2, the third space area SPA3, and the fourth space area SPA4 may be shielded by the third layer 13 although not shown in the drawings. In this case, because an operation in which the third layer 13 shields the first space area SPA1, the second space area SPA2, the third space area SPA3, and the fourth space area SPA4 is the same as or similar to that described above, a detailed description thereof will be omitted. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Figure 11E:
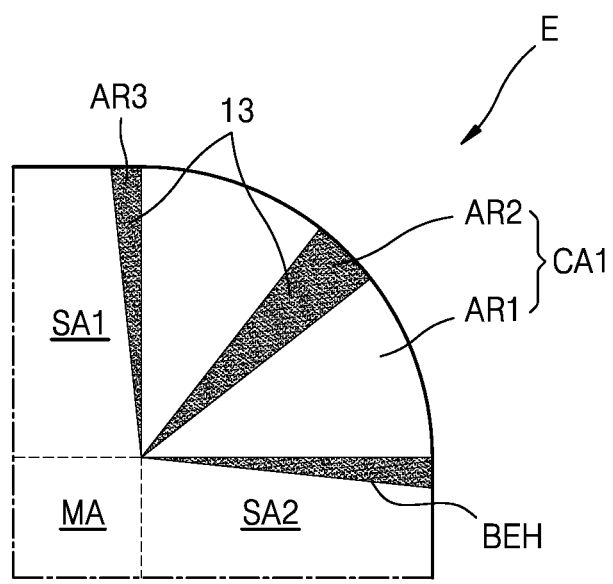

Referring to FIG. 11E, the protective film 10 may further include a third area AR3 in addition to the first area AR1 and the second area AR2 of the first corner area CA1. In this case, the third area AR3 may be a region, in which a cutout groove (not shown) is formed on the second layer 12 and the first layer 11 is exposed to the outside, like the second area AR2. The third area AR3 may be arranged in at least one of the first side area SA1 and the second side area SA2. In this case, the third area AR3 may be disposed at the boundary between the first side area SA1 and the first corner area CA1 and/or at the boundary between the second side area SA2 and the first corner area CA1. In another embodiment, the third area AR3 may be arranged in each of the first side area SA1 and the second side area SA2. In this case, the third area AR3 may be arranged adjacent to the first corner area CA1.

In an embodiment, the third layer 13 may be arranged in the second area AR2 and the third area AR3. In this case, the third layer 13 may individually shield the second area AR2 and the third area AR3. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4.

Figure 11F:
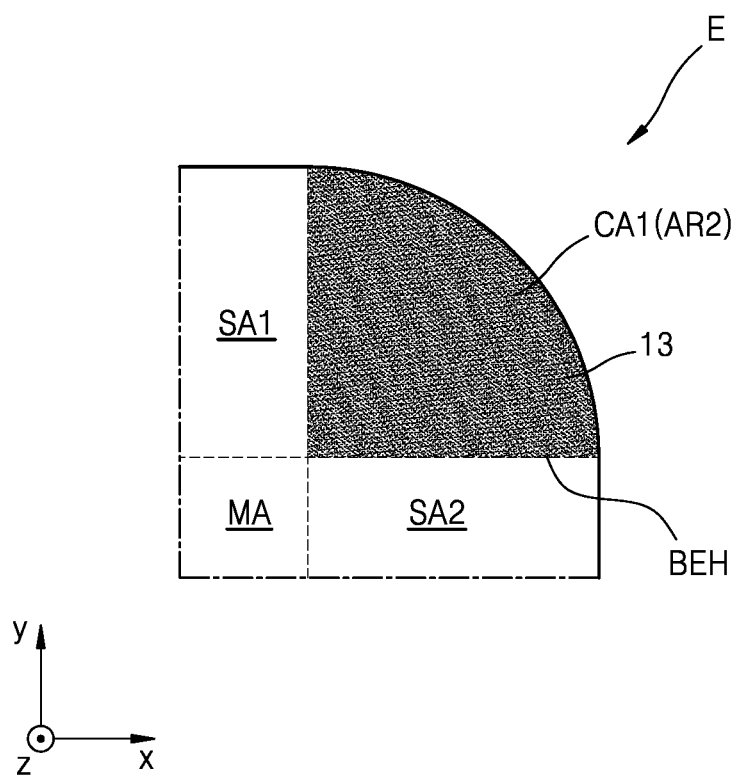

Referring to FIG. 11F, the second area AR2 may be formed to correspond to the first corner area CA1. That is, as the second layer 12 arranged in the first corner area CA1 is completely removed, the first layer 11 may be exposed to the outside in the first corner area CA1. That is, the cutout groove BEH may be formed to correspond to the first corner area CA1.

In the above case, the third layer 13 may be disposed above the cutout groove BEH. In this case, the shape of the third layer 13 may be the same as or similar to that described above. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Although not shown in the drawings, the second area AR2 may be arranged in at least one of the first side area SA1 and the second side area SA2 as well as the first corner area CA1. In this case, the third layer 13 may be arranged to completely shield the second area AR2.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4.

Figure 11G:
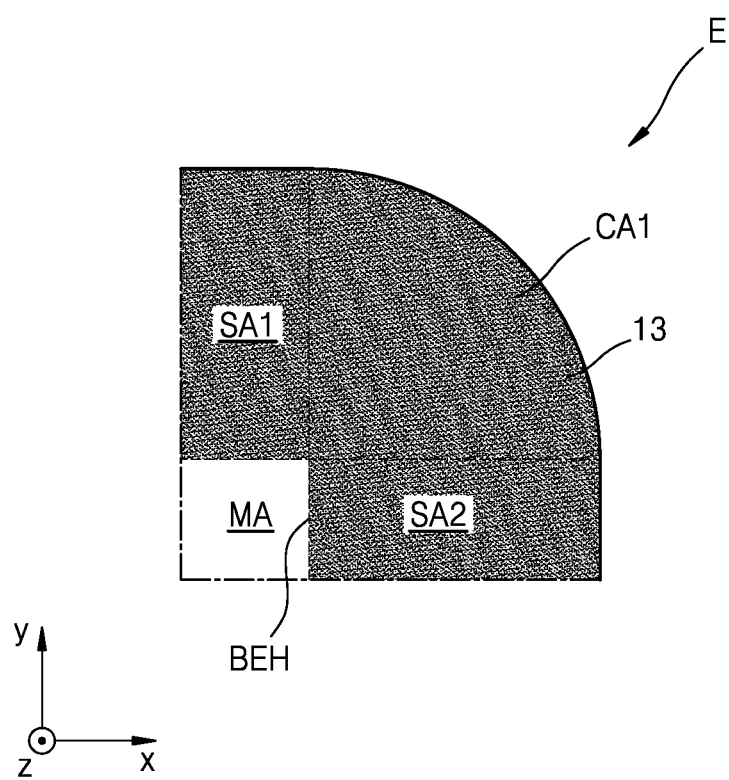

Referring to FIG. 11G, the second area AR2 may be arranged to correspond to the first corner area CA1, at least a portion of the first side area SA1, and at least a portion of the second side area SA2. In this case, the first layer 11 may be exposed to the outside in the second area AR2.

That is, as the second layer 12 arranged in the first corner area CA1, at least a portion of the first side area SA1, and at least a portion of the second side area SA2 may be completely removed, the first layer 11 may be exposed to the outside in the first corner area CA1, at least a portion of the first side area SA1, and at least a portion of the second side area SA2. That is, the cutout groove BEH may be formed to correspond to the first corner area CA1, at least a portion of the first side area SA1, and at least a portion of the second side area SA2.

In the above case, the third layer 13 may be disposed above the cutout groove BEH. In this case, the shape of the third layer 13 may be the same as or similar to that described above. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round. In this case, the third layer 13, which is disposed on at least a portion of the first side area SA1 or at least a portion of the second side area SA2, may help to smoothly change the shape of the first side area SA1 or the second side area SA2 when the first side area SA1 or the second side area SA2 is round.

Although not shown in the drawings, the second area AR2 may be arranged in at least one of the first side area SA1 and the second side area SA2 as well as the first corner area CA1. In this case, the third layer 13 may be arranged to completely shield the second area AR2.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4.

Figure 11H:
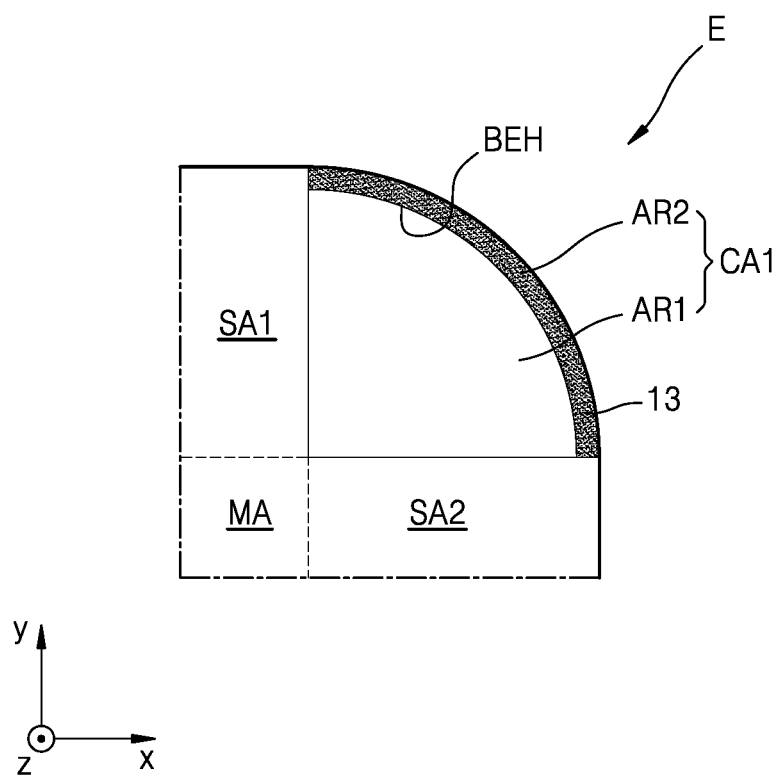

Referring to FIG. 11H, the second area AR2 may be arranged to correspond to at least a portion of the first corner area CA1. In this case, the first layer 11 may be exposed to the outside in the second area AR2.

That is, as the second layer 12 arranged in at least a portion of the first corner area CA1 is completely removed, the first layer 11 may be exposed to the outside in at least a portion of the first corner area CA1. That is, the cutout groove BEH may be formed to correspond to at least a portion of the first corner area CA1. For example, the cutout groove BEH may be formed at an edge end of the first corner area CA1. In another embodiment, the cutout groove BEH may be formed inside the first corner area CA1 in a shape corresponding to the edge of the first corner area CA1. In this case, the cutout groove BEH may have a round shape.

In the above case, the third layer 13 may be disposed above the cutout groove BEH. In this case, the shape of the third layer 13 may be the same as or similar to that described above. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Although not shown in the drawings, the second area AR2 may extend not only to the first corner area CA1 but also to at least one of the first side area SA1 and the second side area SA2. In this case, the third layer 13 may be arranged to completely shield the second area AR2.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4.

Figure 11I:
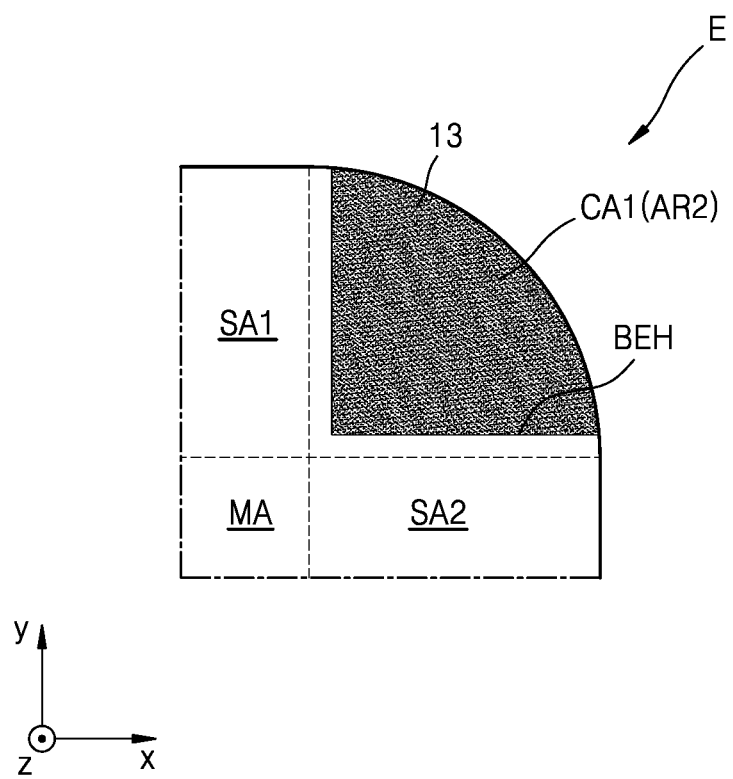

Referring to FIG. 11I, the second area AR2 may be arranged in the first corner area CA1, as shown in FIG. 11F. In this case, the cutout groove BEH may be formed in the second area AR2, and the first layer 11 may be exposed to the outside through the cutout groove BEH.

In the above case, the third layer 13 may be disposed only in at least a portion of the second area AR2. For example, the third layer 13 may be disposed outside the first corner area CA1. In particular, the third layer 13 may be arranged between the first side area SA1 and the first corner area CA1, and may be arranged between the second side area SA2 and the second corner area CA2. In this case, portions of the third layer 13, which are parallel to the first side area SA1 and the second side area SA2, respectively, may be connected to or separated from each other.

Although not shown in the drawings, the second area AR2 may extend not only to the first corner area CA1 but also to at least one of the first side area SA1 and the second side area SA2. In this case, the third layer 13 may be arranged to completely shield the second area AR2. In the above case, when a certain temperature is reached or heat is applied to each third layer 13, as described with reference to FIG. 11A, the third layer 13 may change from a flat shape to a memorized shape, thereby helping each corner area of the protective film 10 to be smoothly round.

Although the first side area SA1, the second side area SA2, and the first corner area CA1 have been described above as a reference, the same may also apply to the third side area SA3, the fourth side area SA4, the second corner area CA2, the third corner area CA3, and the fourth corner area CA4.

FIGS. 12A to 12D are schematic side views illustrating a part of a method of manufacturing a display device 1, according to an embodiment. FIG. 12E is a perspective view illustrating a method of manufacturing a display device 1, according to an embodiment. FIGS. 12F to 12I are schematic side views illustrating a part of a method of manufacturing a display device 1, according to an embodiment.

Figure 12A:
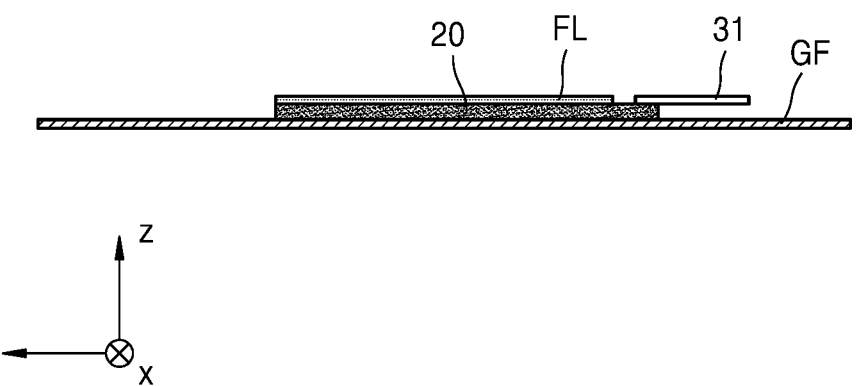
FIGS. 12A to 12D are schematic side views illustrating a part of a method of manufacturing a display device, according to an embodiment.

Referring to FIG. 12A, a guide film GF may be attached to a display panel 20 and the rear surface of a functional layer FL on the display panel 20. The display panel 20 may be the display panel 20 shown in FIG. 3. In this case, the functional layer FL and a display circuit board 31 may be disposed on the front surface of the display panel 20.

In an embodiment, when the guide film GF is attached to the lower surface of the display panel 20, the guide film GF may be attached thereto such that the display panel corresponds to a middle area MA (refer to FIG. 10A) of the guide film GF. Specifically, the guide film GF may be attached to the display panel 20 such that a main display area FDA (refer to FIG. 3), an auxiliary display area SDA (refer to FIG. 3), an intermediate display area MDA (refer to FIG. 3), and a corner display area CDA (refer to FIG. 3) of the display panel 20 all correspond to the middle area MA of the guide film GF. In this case, an edge area EA (refer to FIG. 13) of the guide film GF may not overlap the display panel in a plan view.

Figure 12B:
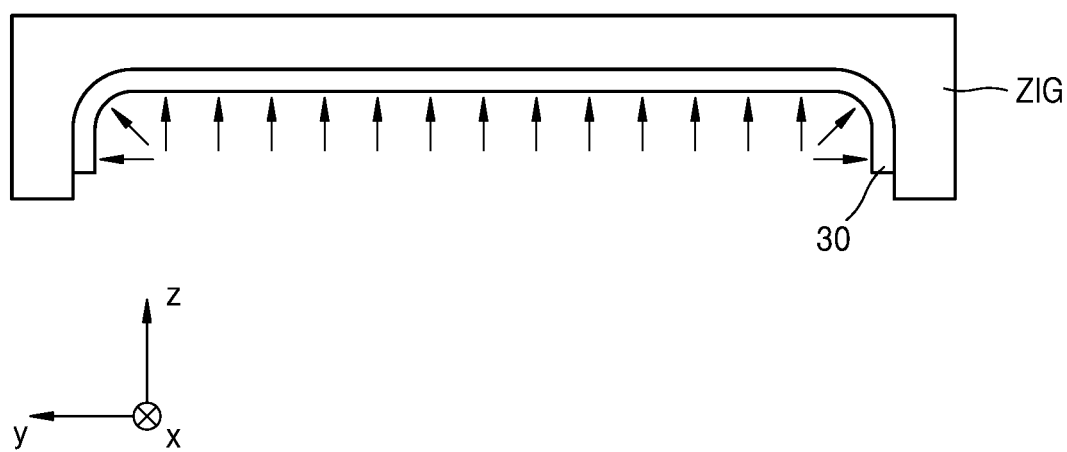

Referring to FIG. 12B, in order to prepare a cover window 30, the cover window may be deformed to have a flat surface and a curved surface by using a jig ZIG including a concave surface corresponding to a final shape of the cover window 30. That is, the jig ZIG may be a frame having the shape of a display device to be finally manufactured. By closely attaching the cover window 30 to the concave surface of the jig ZIG, the cover window 30 may be deformed according to the shape of the concave surface of the jig ZIG.

Figure 12C:
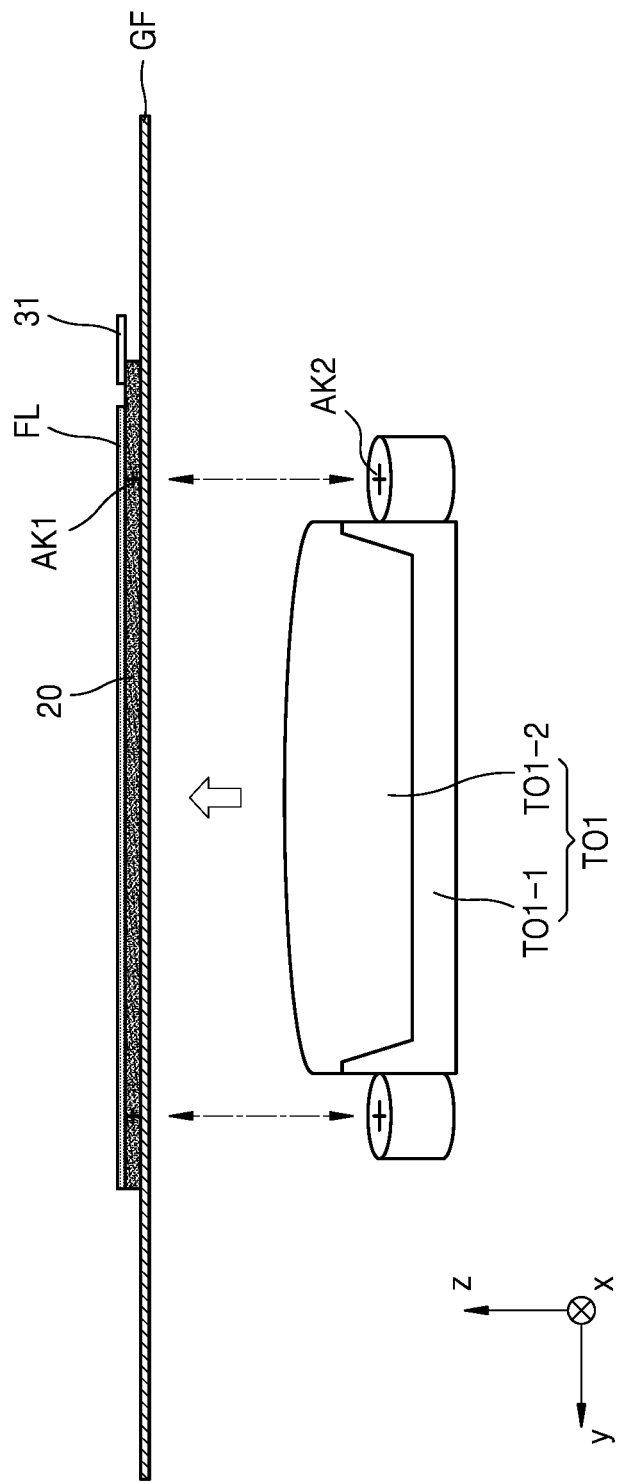

Referring to FIG. 12C, a first lamination device TO1 including a first support portion TO1-1 and a first volume change portion TO1-2 on the first support portion TO1-1 may be prepared. The first support portion TO1-1 may support the first volume change portion TO1-2. The first volume change portion TO1-2 may include an air pump or be connected to an air pump. The first volume change portion TO1-2 may have a low modulus, and thus, the shape and volume of the first volume change portion TO1-2 may be changed according to air pressure through the air pump. Alternatively, the first volume change portion TO1-2 may include a diaphragm. In another embodiment, the first volume change portion TO1-2 may include a pad, such as silicone or rubber.

The rear surface of the display panel 20 may be arranged to face the first lamination device TO1. That is, the guide film GF may be arranged to be placed on the side of the first lamination device TO1. Next, the display panel 20 and the first lamination device TO1 may be aligned. For example, the display panel 20 and the first lamination device TO1 may be aligned such that a first alignment key AK1 displayed on the display panel 20 matches a second alignment key AK2 displayed on the first lamination device TO1.

Figure 12D:
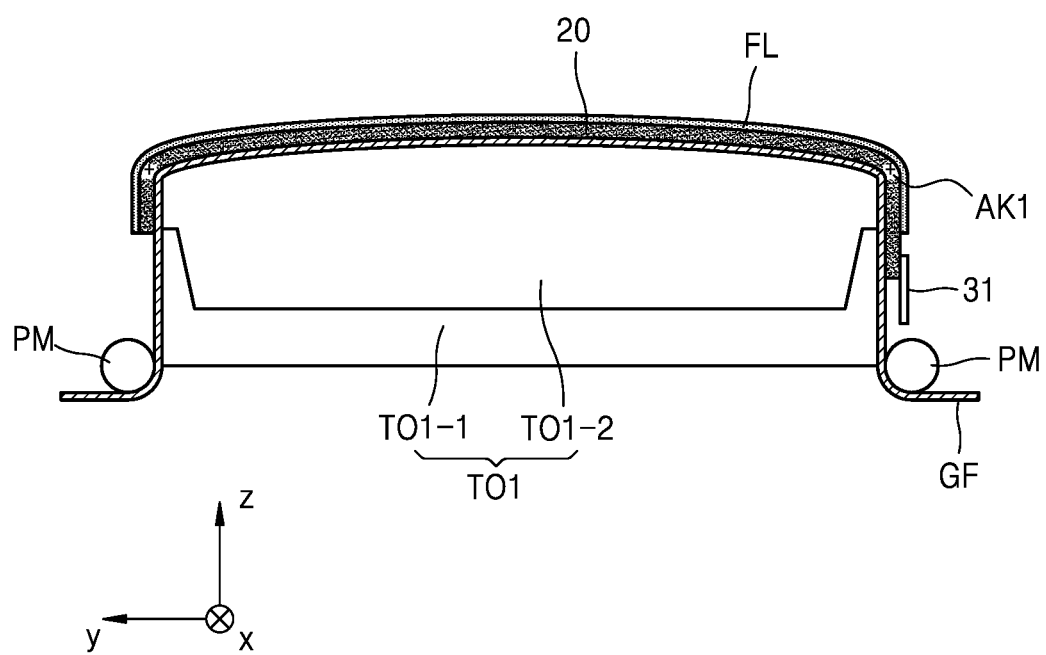
Figure 12E:
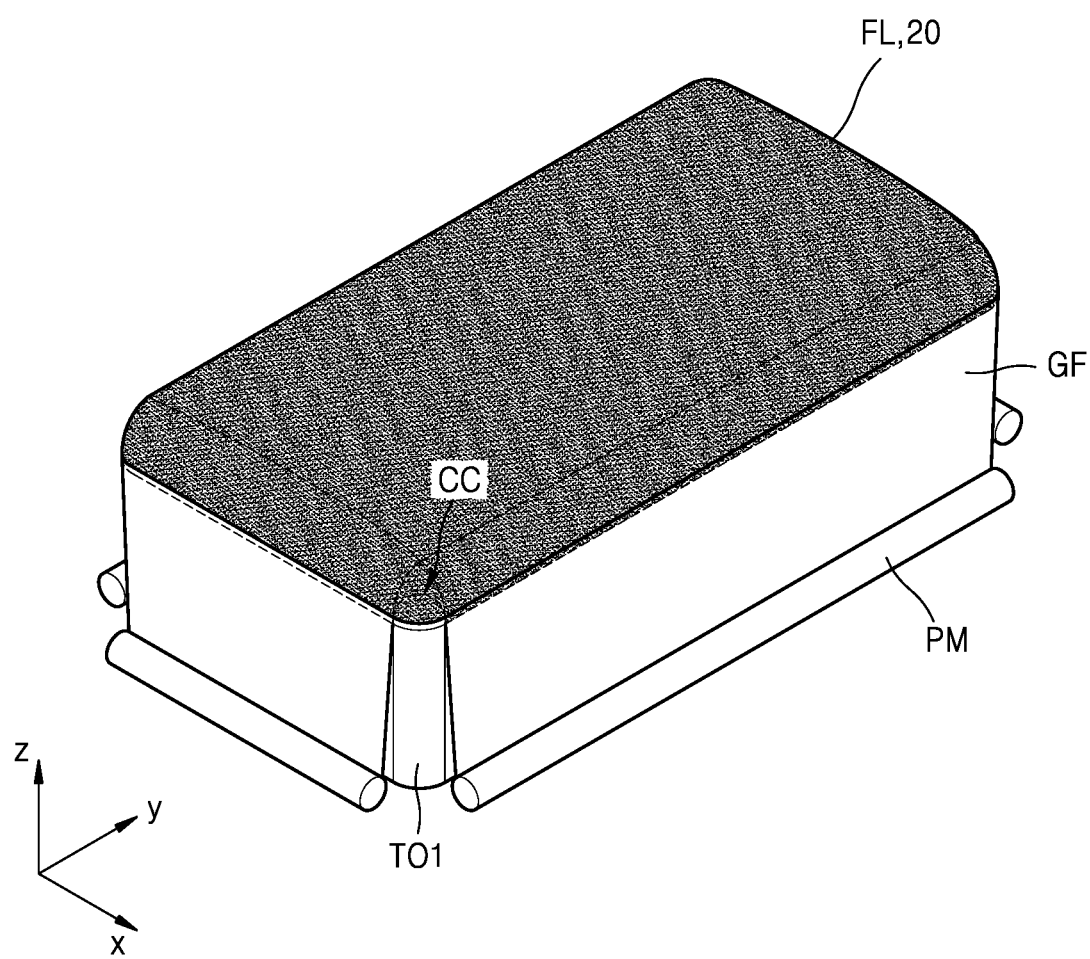
FIG. 12E is a perspective view illustrating a method of manufacturing a display device, according to an embodiment.

Referring to FIG. 12D, the display panel 20 may be preformed through the guide film GF. For example, the shape of the display panel 20 may be deformed by applying an external force, for example, a tensile force, to the guide film GF.

Specifically, the guide film GF may be seated on the first lamination device TO1. A push member PM may be located on the guide film GF, and the guide film GF may be closely attached to the side surface of the first lamination device TO1 by using the push member PM. For example, when push members PM press edge areas EA of the guide film GF, respectively, a tensile force may be applied to the guide film GF and the guide film GF may be deformed along the outer surface of the first lamination device TO1, and thus, the display panel 20 on the guide film GF may also be deformed, such as appropriately bend.

Referring to FIG. 12E, the shapes of the functional layer FL and the display panel preformed through the guide film GF may be confirmed.

Figure 12F:
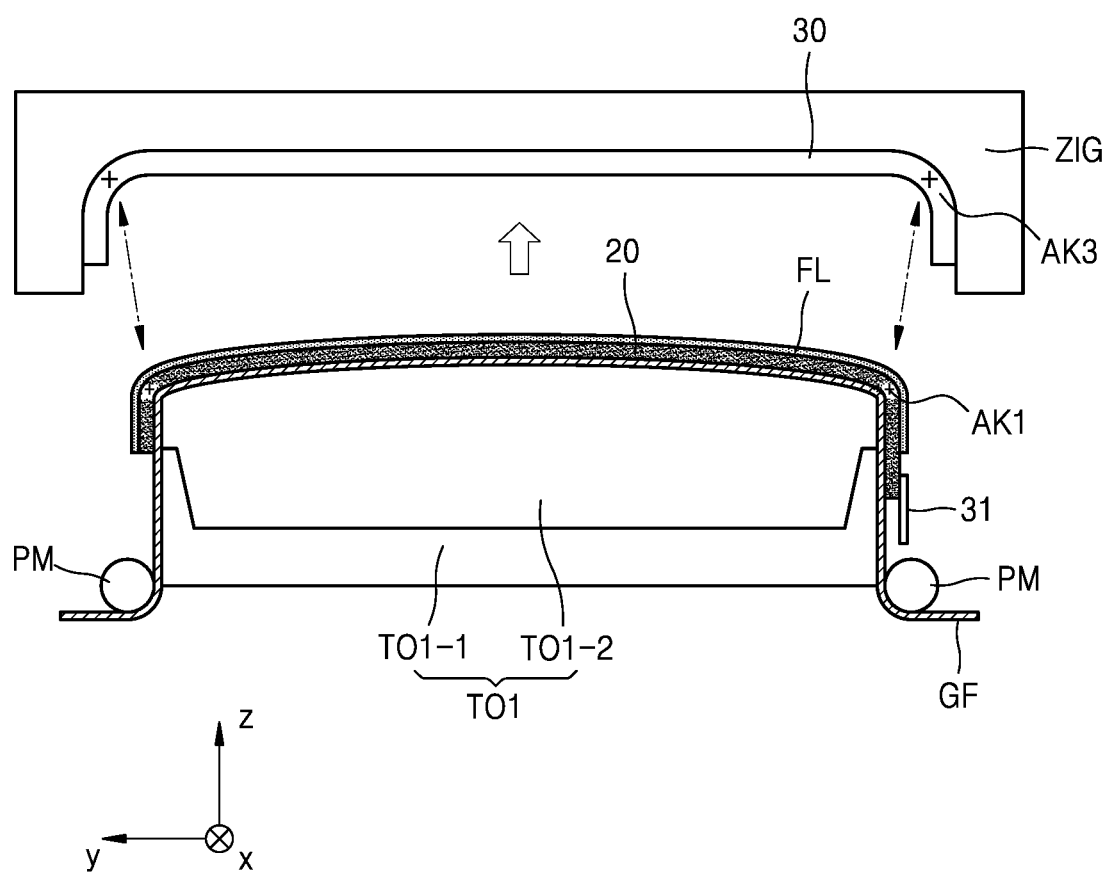
FIGS. 12F to 12I are schematic side views illustrating a part of a method of manufacturing a display device, according to an embodiment.

Referring to FIG. 12F, after the display panel 20 is preformed, the front surface of the display panel 20 may be arranged to face the cover window 30 and the display panel and the cover window 30 may be aligned. The display panel 20 and the cover window may be aligned such that the first alignment key AK1 displayed on the display panel matches a third alignment key AK3 displayed on the cover window 30.

Figure 12G:
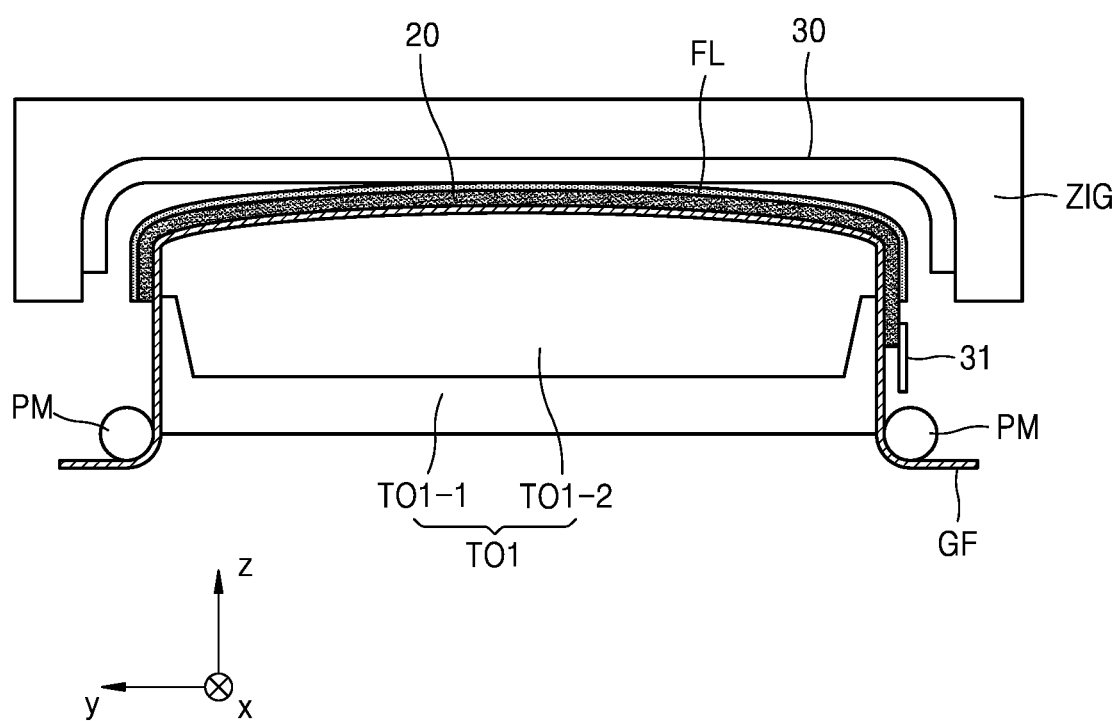
Figure 12H:
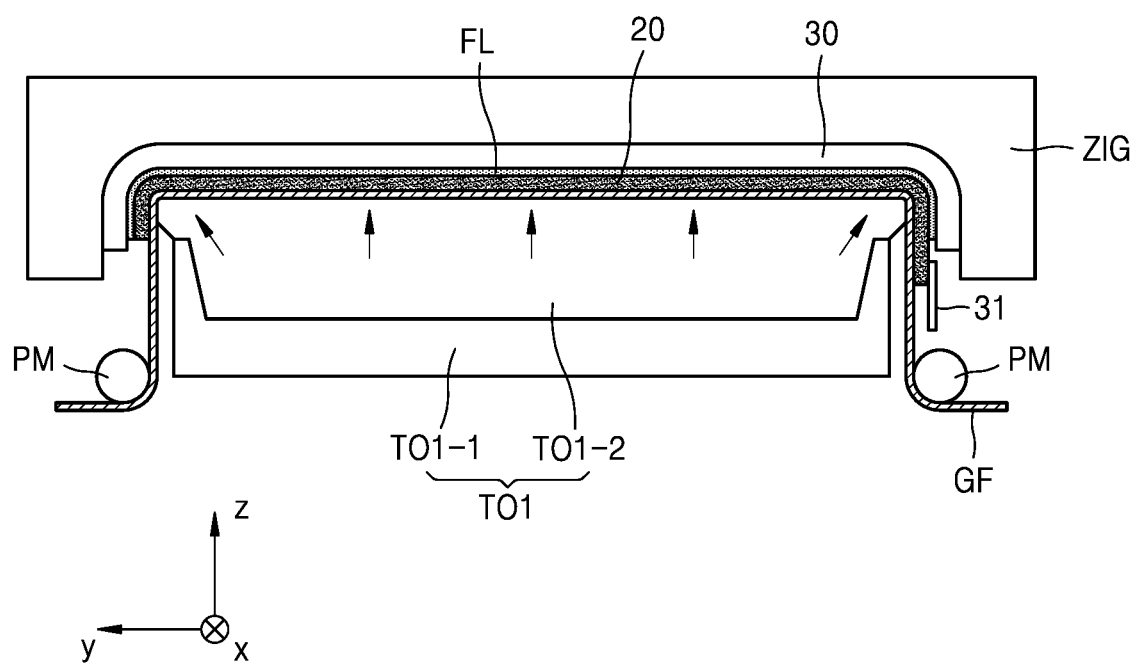

Referring to FIGS. 12G and 12H, the cover window 30 may be attached to the front surface of the display panel 20. For example, as shown in FIG. 12G, a portion of the display panel 20 may be attached to the cover window 30 first. In a final shape of the display panel 20, a flat surface (e.g., the main display area FDA) having no curvature may be attached to the cover window 30 first.

Next, as shown in FIG. 12H, as the shape of the first volume change portion TO1-2 of the first lamination device TO1 changes and the volume of the first volume change portion TO1-2 increases, the remaining portions of the display panel 20, for example, the auxiliary display area SDA and the corner display area CDA, may be attached to the cover window 30.

A process of attaching the auxiliary display area SDA to the cover window 30 and a process of attaching the corner display area CDA to the cover window 30 may be simultaneously performed. For example, when the auxiliary display area SDA and the cover window 30 are attached to each other, the corner display area CDA may naturally contact and attach to the cover window 30 by a peripheral external force. In another example, a process of attaching the auxiliary display area SDA to the cover window 30 and a process of attaching the corner display area CDA to the cover window 30 may be performed at a different time. For example, the auxiliary display area SDA and the cover window 30 may be attached to each other first, and then the corner display area CDA and the cover window 30 may be attached to each other.

Figure 12I:
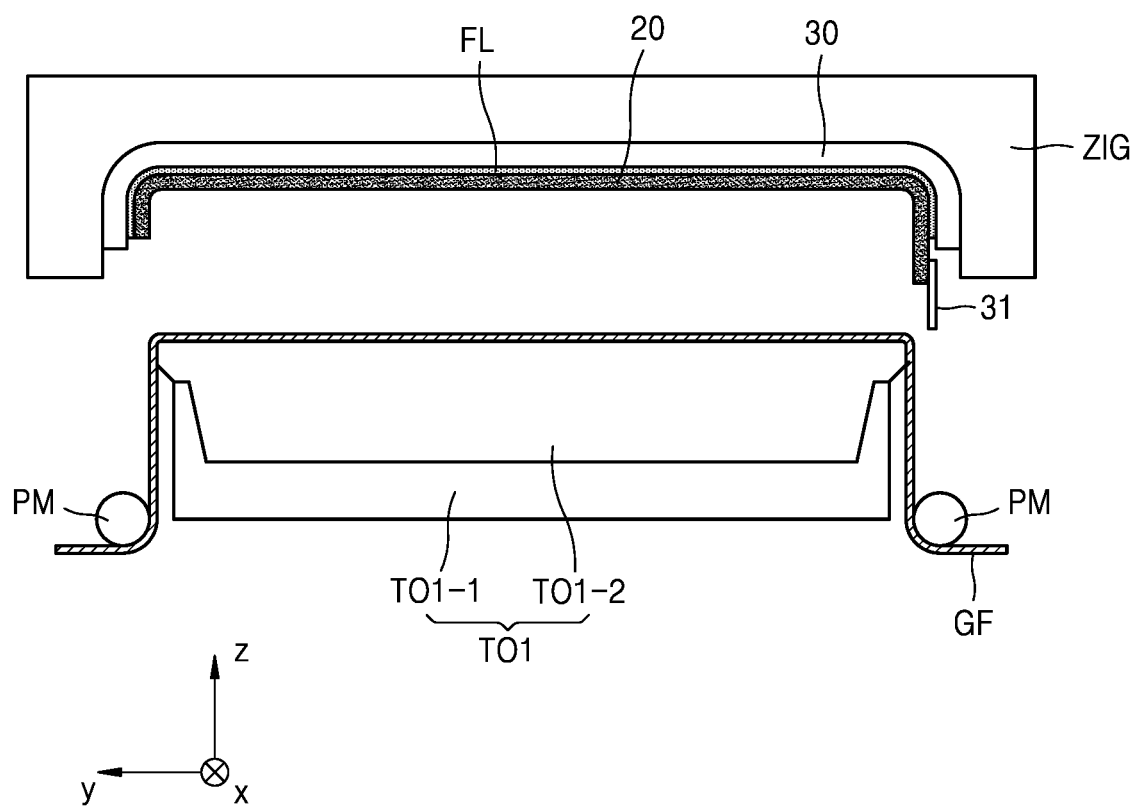

Referring to FIG. 12I, after the display panel 20 is attached to the cover window the guide film GF may be removed from the display panel 20 to which the cover window 30 is attached. For example, ultraviolet ("UV") may be irradiated to an adhesive member (not shown), which attaches the guide film GF and the display panel 20 to each other, to weaken the adhesive force of the adhesive member, and thus, the guide film GF and the display panel 20 may be separated from each other.

When the above process is completed, an operation of curing the cover window and the display panel 20 may be performed. For example, curing may be performed by irradiating UV to the cover window 30 and the display panel 20. When UV is irradiated to the cover window 30 and the display panel 20, air bubbles or the like may escape from the adhesive member attached to the display panel 20.

Although the display device 1 of FIG. 1B has been described as an example with reference to FIGS. 12A to 12I, this is for convenience of description, and the above descriptions may equally apply to the display device 1 of FIG. 1A. In this case, the description regarding the corner display area CDA of the display device 1 of FIG. 1B may apply to the display device corner area DCA of the display device 1 of FIG. 1A.

Figure 13:
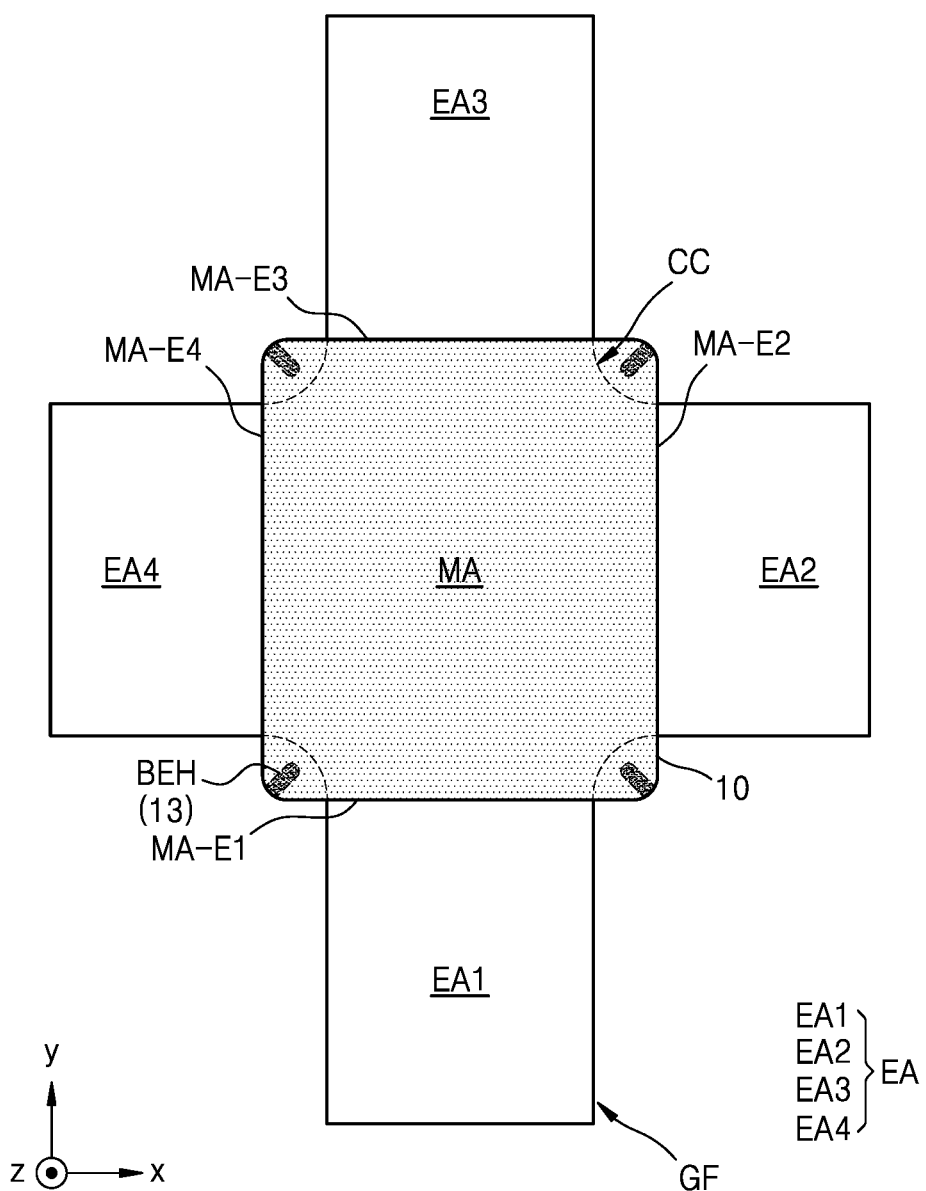
FIG. 13 is a schematic plan view illustrating a guide film and a protective film according to an embodiment.

FIG. 13 is a schematic plan view illustrating a guide film GF and a protective film according to an embodiment.

Referring to FIG. 13, after the functional layer FL (refer to FIG. 8) and the display panel 20 (refer to FIG. 8) are attached to the cover window 30 (refer to FIG. 8), a protective film 10 may be attached to the display panel 20.

Specifically, the guide film GF may be attached to the rear surface of the protective film 10. In this case, the guide film GF may be a guide film that is the same as or different from the guide film GF shown in FIG. 12E. Hereinafter, for convenience of description, a case, in which the guide film GF is different from the guide film GF shown in FIG. 12E, will be described in detail.

In an embodiment, the guide film GF may include a middle area MA and an edge area EA connected to each edge of the middle area MA. For example, the guide film GF may include a first edge area EA1 connected to a first outline MA-E1 of the protective film a second edge area EA2 connected to a second outline MA-E2 of the protective film a third edge area EA3 connected to a third outline MA-E3 of the protective film 10, and a fourth edge area EA4 connected to a fourth outline MA-E4 of the protective film 10.

The middle area MA of the guide film GF may include a concave corner CC so as not to overlap the corner area CA of the protective film 10 in a plan view.

Although FIG. 13 illustrates that the guide film GF includes four edge areas EA, the disclosure is not limited thereto, and less or more than four edge areas EA may be provided according to the shape of the display device 1 in another embodiment. In addition, although FIG. 13 illustrates that the edge area EA has a quadrangular shape in a plan view, the edge area EA may have various shapes, for example, a polygon such as a triangle, a portion of a circle, and a portion of an ellipse.

In an embodiment, the guide film GF may be attached to the lower surface of the protective film 10 to overlap the protective film 10 in a plan view. The middle area MA of the guide film GF may be attached to the protective film 10 to overlap the protective film in a plan view. Although FIG. 13 illustrates that the edge of a first portion of the protective film 10 match the edge of the middle area MA of the guide film GF, the disclosure is not limited thereto.

As described above, the protective film 10 may correspond to the main display area FDA, the auxiliary display area SDA, the intermediate display area MDA, and the corner display area CDA of the display panel 20.

The protective film 10 may have a shape corresponding to the display area DA and the peripheral area PA of the display panel 20 in a plane view. For example, the protective film 10 may have a quadrangular shape with round corners in a plan view, as shown in FIG. 13.

A cutout groove BEH of the protective film 10 may help to favorably bend the corner area CA (refer to FIG. 10A) of the protective film 10 when the protective film 10 is preformed using the guide film GF.

As a comparative example, when the cutout groove BEH is not provided, even when the corner area CA of the protective film 10 bends well when the protective film 10 is preformed using the guide film GF, the corner area CA may be incompletely bent.

When the protective film 10 is bent in this state, buckling or wrinkles may occur in the corner area CA. Alternatively, the protective film 10 may be damaged in the corner area CA.

After the protective film 10 is disposed on the guide film GF as described above, preforming may be performed through a display device manufacturing apparatus, which will be described later.

Figure 14A:
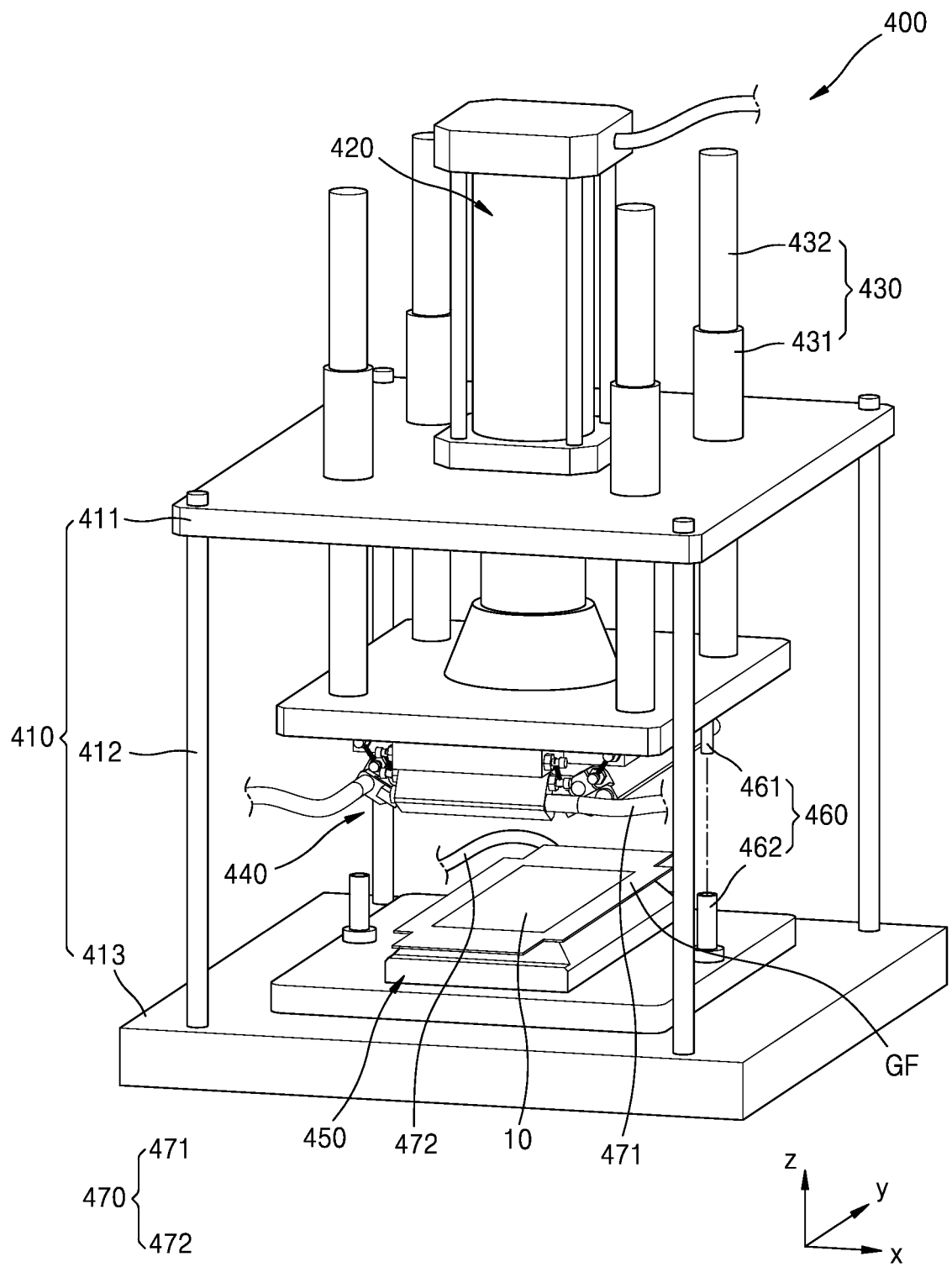
FIG. 14A is a perspective view illustrating a display device manufacturing apparatus according to an embodiment.
Figure 14B:
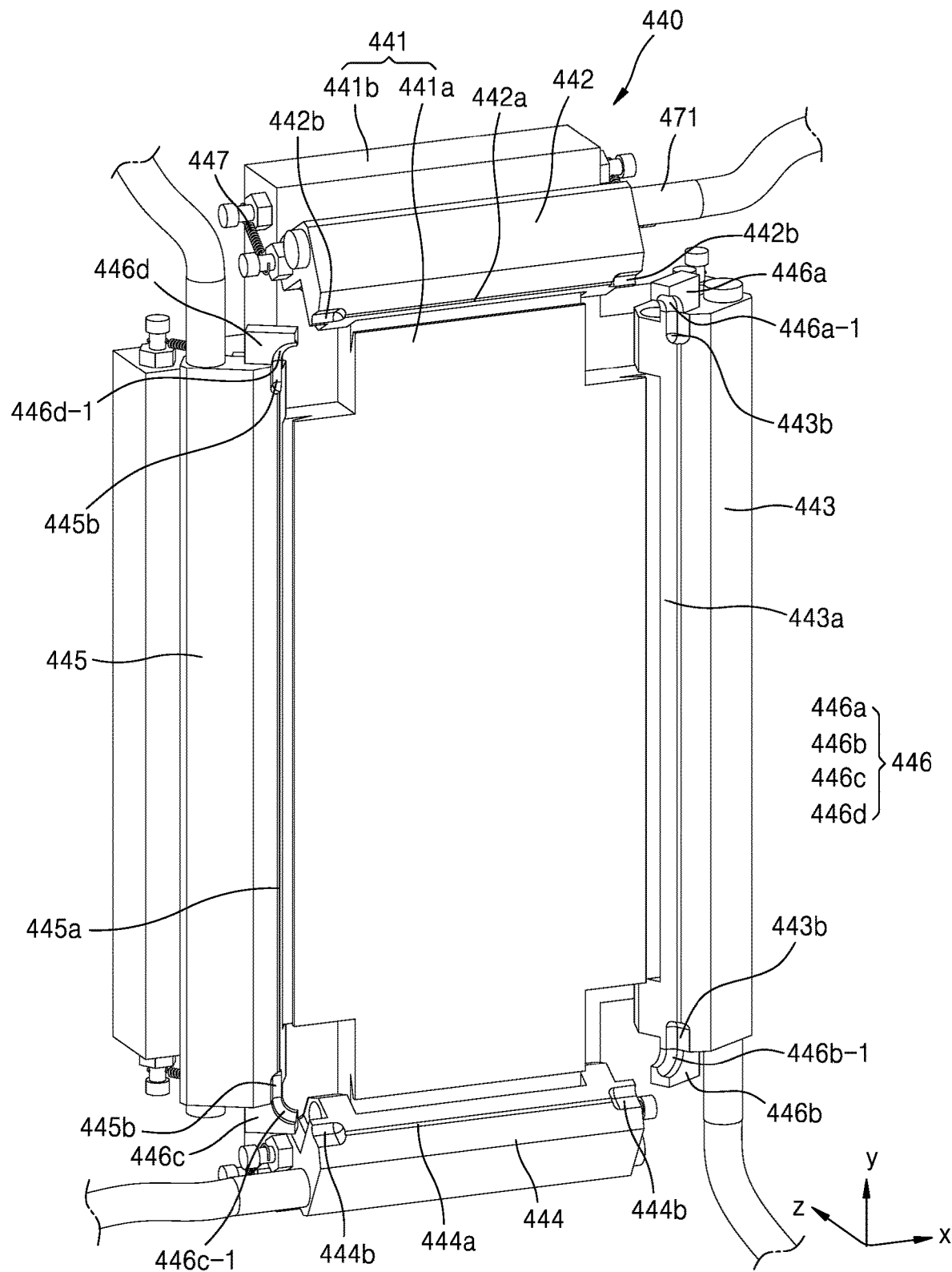
FIG. 14B is a schematic perspective view illustrating a portion of the display device manufacturing apparatus shown in FIG. 14A.

FIG. 14A is a perspective view illustrating a display device manufacturing apparatus 400 according to an embodiment. FIG. 14B is a schematic perspective view illustrating a portion of the display device manufacturing apparatus 400 shown in FIG. 14A.

Referring to FIGS. 14A and 14B, the display device manufacturing apparatus 400 may include a body 410, a driver 420, a guide portion 430, a first jig portion (not shown), a second jig portion 440, a stopper 460, and a heater 470.

The body 410 may form a space therein, and may include a first body 411 and a second body 413 which are arranged apart from each other. In addition, the body 410 may include a body connector 412 connecting the first body 411 and the second body 413 to each other. In this case, the first body 411 and the second body 413 may each have a plate shape, and the body connector 412 may have a bar shape. In addition, a plurality of body connectors 412 may be provided, and the plurality of body connectors 412 may be arranged apart from each other to support the first body 411.

The driver 420 may be fixed to the body 410 and may be connected to the second jig portion 440. In this case, the driver 420 may linearly move the second jig portion 440 in one direction. For example, the driver 420 may raise and lower the second jig portion 440.

The driver 420 may be formed in various shapes. For example, the driver 420 may be disposed on the first body 411 and may include a cylinder having a shaft connected to the second jig portion 440. In another embodiment, the driver 420 may be disposed on the first body 411 and may include a linear motor connected to the second jig portion 440. In another embodiment, the driver 420 may include a motor disposed on the first body 411, a spur gear connected to the motor, and a rack gear connected to the second jig portion 440 while interlocking with the spur gear. In this case, the driver 420 is not limited thereto, and may include any device disposed on the body 410 to linearly move the second jig portion 440 in another embodiment. However, hereinafter, for convenience of description, a case in which the driver 420 includes a cylinder will be described in detail.

The guide portion 430 may be arranged to pass through the first body 411 to guide the movement of the second jig portion 440. In this case, the guide portion 430 may include a guide 431 fixed to the first body 411 and a slider 432 inserted into the guide 431 to linearly move. In this case, the guide 431 may be in the form of a rod having a space therein, and the slider 432 may be in the form of a bar.

The first jig portion may be arranged to face the second jig portion 440. In this case, the first jig portion may include a first jig 450 on which a protective film 10 is seated. In this case, the side of the first jig 450 may be retracted. For example, although not shown in the drawings, the side of the first jig 450 may have a 'Z' shape. For example, the first jig 450 may have a guide groove formed to be drawn into the side of the first jig 450.

The second jig portion 440 may be connected to the driver 420 to linearly move. In this case, the second jig portion 440 may be connected to the slider 432, and the slider 432 may guide the movement of the second jig portion 440 when the second jig portion 440 moves.

The second jig portion 440 may include a second jig 441, a first rotation jig 442, a second rotation jig 443, a third rotation jig 444, a fourth rotation jig 445, a corner jig 446, and an elastic portion 447.

The second jig 441 may be arranged in the center of a panel member (e.g., the protective film 10 and the guide film GF), and may selectively contact the panel member. In this case, a case, in which the panel member is a protective film 10 to be described below, will be described in detail.

A central portion of the second jig 441 may be flat, and a side portion of the second jig 441 may be formed to protrude laterally from the central portion of the second jig 441. In this case, the second jig 441 may have a cross shape. In particular, when the second jig 441 contacts the protective film 10, the second jig 441 may not come into contact with an edge portion of the protective film 10. In this case, the second jig 441 may include a contact portion 441a and a connector 441b connected to the contact portion 441a. In this case, the contact portion 441a may be formed to have a cross shape, and the connector 441b may be connected to the driver 420.

The first rotation jig 442, the second rotation jig 443, the third rotation jig 444, and the fourth rotation jig 445 may be rotatably disposed on the second jig 441. In this case, the first rotation jig 442, the second rotation jig 443, the third rotation jig 444, and the fourth rotation jig 445 may be provided. The first rotation jig 442, the second rotation jig 443, the third rotation jig 444, and the fourth rotation jig 445 may be arranged apart from each other. Two of the first rotation jig 442, the second rotation jig 443, the third rotation jig 444, and the fourth rotation jig 445 may have the same size and shape as each other, and the other two of the first rotation jig 442, the second rotation jig 443, the third rotation jig 444, and the fourth rotation jig 445 may have different sizes and shapes. For example, the size and shape of the first rotation jig 442 may be the same as the size and shape of the third rotation jig 444, and the size and shape of the second rotation jig 443 may be the same as the size and shape of the fourth rotation jig 445. On the other hand, the size and shape of the first rotation jig 442 may be different from the size and shape of the second rotation jig 443. In particular, the length of the first rotation jig 442 may be less than the length of the second rotation jig 443. That is, the length of the second rotation jig 443 may be greater than the length of the first rotation jig 442. In this case, when the planar shape of the protective film 10 is a quadrangle, the protective film 10 may have a long side and a short side. As used herein, the "planar shape" means a shape of an object in an unbent state. When the short side of the protective film 10 bends, the first rotation jig 442 may be used, and when the long side of the protective film 10 bends, the second rotation jig 443 may be used. The relationship between the first rotation jig 442 and the second rotation jig 443 may equally apply to the relationship between the third rotation jig 444 and the fourth rotation jig 445, the relationship between the first rotation jig 442 and the fourth rotation jig 445, and the relationship between the second rotation jig 443 and the third rotation jig 444. Because the first rotation jig 442, the second rotation jig 443, the third rotation jig 444, and the fourth rotation jig 445 are the same or similar to one another, hereinafter, for convenience of description, the first rotation jig 442 and the second rotation jig 443 will be mainly described in detail.

The first rotation jig 442 may be rotatably connected to the second jig 441. The first rotation jig 442 may include a first seating groove 442a and a first corner groove 442b. In this case, an edge of the protective film 10 may be disposed on the first seating groove 442a. In this case, the protective film 10 may be inserted into the first seating groove 442a. The first corner groove 442b may be arranged at opposite end corners of the first rotation jig 442. The first corner groove 442b may correspond to a corner portion of the protective film 10, and the inner surface of the first corner groove 442b may be round.

The second rotation jig 443 may be arranged in a direction different from the arranged direction of the first rotation jig 442. For example, a longitudinal direction (e.g., an x direction in FIG. 2) of the first rotation jig 442 may be different from a longitudinal direction (e.g., a y direction in FIG. 2) of the second rotation jig 443. The second rotation jig 443 may include a second seating groove 443a and a second corner groove 443b. In this case, one of the edges of the protective film 10 may be seated in the second seating groove 443a. The second corner groove 443b may be in contact with a corner portion of the protective film 10 to make the corner portion of the protective film 10 round.

The third rotation jig 444 may have a shape similar to the shape of the first rotation jig 442, and may include a third seating groove 444a and a third corner groove 444b. In addition, the fourth rotation jig 445 may have a shape similar to the shape of the second rotation jig 443, and may include a fourth seating groove 445a and a fourth corner groove 445b.

The corner jig 446 may be arranged to correspond to an edge of the protective film 10. In this case, the corner jig 446 may be connected to each of the second rotation jig 443 and the fourth rotation jig 445. In this case, a plurality of corner jigs 446 may be provided. For example, the plurality of corner jigs 446 may include a first corner jig 446a, a second corner jig 446b, a third corner jig 446c, and a fourth corner jig 446d. In this case, the first corner jig 446a, the second corner jig 446b, the third corner jig 446c, and the fourth corner jig 446d may be arranged to correspond to corners of the protective film 10, respectively. In this case, the first corner jig 446a and the second corner jig 446b may be arranged at opposite ends of the second rotation jig 443, respectively, and fixed to the second rotation jig 443. In addition, the third corner jig 446c and the fourth corner jig 446d may be arranged at opposite ends of the fourth rotation jig 445, respectively, and fixed to the fourth rotation jig 445. In the above case, because the first corner jig 446a, the second corner jig 446b, the third corner jig 446c, and the fourth corner jig 446d are the same or similar to one another, hereinafter, for convenience of description, the first corner jig 446a will be mainly described in detail.

The first corner jig 446a may be connected to the second rotation jig 443 and rotate together with the second rotation jig 443 when the second rotation jig 443 rotates. In this case, the first corner jig 446a may have a first forming groove 446a-1 to round an edge of the protective film 10. In this case, the first forming groove 446a-1 may be connected to the second corner groove 443b of the second rotation jig 443. The first forming groove 446a-1 and the second corner groove 443b may form one of the corners of the protective film 10 to be round, and may guide forming the corner of the protective film 10 when one of the corners of the protective film 10 is formed.

The second corner jig 446b may include a second forming groove 446b-1, the third corner jig 446c may include a third forming groove 446c-1, and the fourth corner jig 446d may include a fourth forming groove 446d-1. In this case, the second forming groove 446b-1 may be connected to the second corner groove 443b, and the third forming groove 446c-1 and the fourth forming groove 446d-1 may be connected to the third corner groove 444b and the fourth corner groove 445b, respectively.

An elastic portion 447 may be arranged between the first rotation jig 442, the second rotation jig 443, the third rotation jig 444, and the fourth rotation jig 445 and the second jig 441. In this case, the elastic portion 447 may rotate the first rotation jig 442, the second rotation jig 443, the third rotation jig 444, and the fourth rotation jig 445 by providing an elastic force to each of the first rotation jig 442, the second rotation jig 443, the third rotation jig 444, and the fourth rotation jig 445 according to the movement of the second jig 441. A plurality of elastic portions 447 may be provided, and the elastic portions 447 may be diagonally connected to the first rotation jig 442, the second rotation jig 443, the third rotation jig 444, and the fourth rotation jig 445, respectively.

The stopper 460 may adjust the distance between the second jig portion 440 and the first jig 450. For example, the stopper 460 may include a first stopper 461 disposed on the second jig portion 440 and a second stopper 462 disposed on the first jig 450 or the second body 413. In this case, one of the first stopper 461 and the second stopper 462 may be insertable into the other one of the first stopper 461 and the second stopper 462. That is, when one of the first stopper 461 and the second stopper 462 approaches the other one of the first stopper 461 and the second stopper 462, one of the first stopper 461 and the second stopper 462 may be inserted into the other one of the first stopper 461 and the second stopper 462 up to a certain distance. In this case, one of the first stopper 461 and the second stopper 462 may have a bar shape, and the other one of the first stopper 461 and the second stopper 462 may have a cylindrical shape with a space therein. Hereinafter, for convenience of description, a case, in which the second stopper 462 has a cylindrical shape with a space therein and the first stopper 461 has a bar shape, will be described in detail.

The heater 470 may be disposed on at least one of the second jig portion 440 (specifically each of the first rotation jig 442, the second rotation jig 443, the third rotation jig 444, and the fourth rotation jig 445), and the first jig portion. Hereinafter, for convenience of description, a case, in which the heater 470 is disposed on each of the first rotation jig 442, the second rotation jig 443, the third rotation jig 444, and the fourth rotation jig 445 and the first jig portion, will be described in detail.

The heater 470 may include a first heater 471 disposed on each of the first rotation jig 442, the second rotation jig 443, the third rotation jig 444, and the fourth rotation jig 445, and a second heater 472 disposed on the first jig portion. In this case, the first heater 471 and the second heater 472 may be formed to have various shapes. For example, the first heater 471 and the second heater 472 may each include a bar-shaped heater. In this case, the first heater 471 may be inserted into each of the first rotation jig 442, the second rotation jig 443, the third rotation jig 444, and the fourth rotation jig 445, and the second heater 472 may be inserted into the first jig 450 of the first jig portion. The first heater 471 and the second heater 472 may heat the protective film 10 so that the protective film 10 may bend with a small force when the protective film 10 bends. In this case, the first heater 471 and the second heater 472 may heat the first rotation jig 442, the second rotation jig 443, the third rotation jig 444, and the fourth rotation jig 445 and the first jig 450, which do not directly contact the protective film 10 and contact the protective film 10 when the protective film 10 bend, and thus may not only uniformly apply heat to the protective film 10, but may also prevent damage to the protective film 10 caused by applying excessive heat.

Accordingly, the display device manufacturing apparatus 400 may prevent a corner area of the protective film 10 from being damaged when the protective film 10 is formed through each corner jig 446. In addition, the display device manufacturing apparatus 400 may form a round corner area of the protective film 10 through each corner jig 446.

Figure 15A:
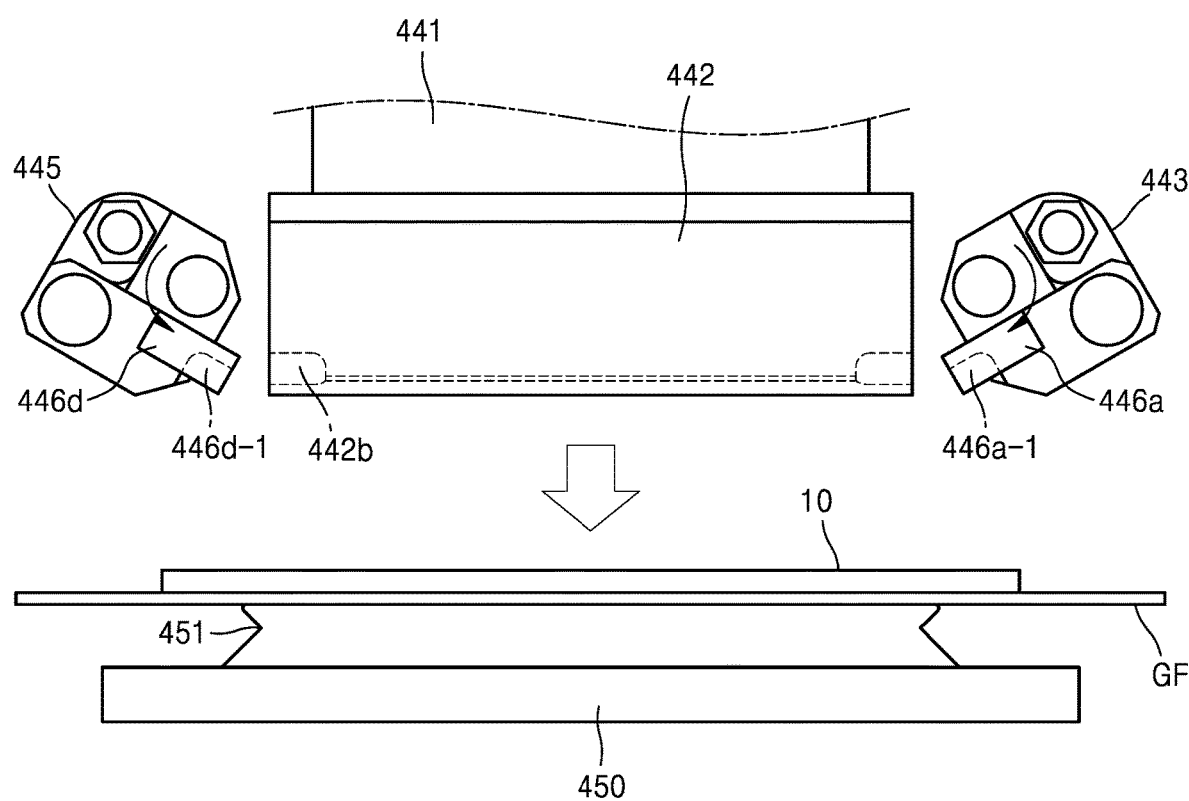
FIGS. 15A and 15B are schematic side views illustrating a method of bending a protective film through the display device manufacturing apparatus shown in FIG. 14A.
Figure 15B:
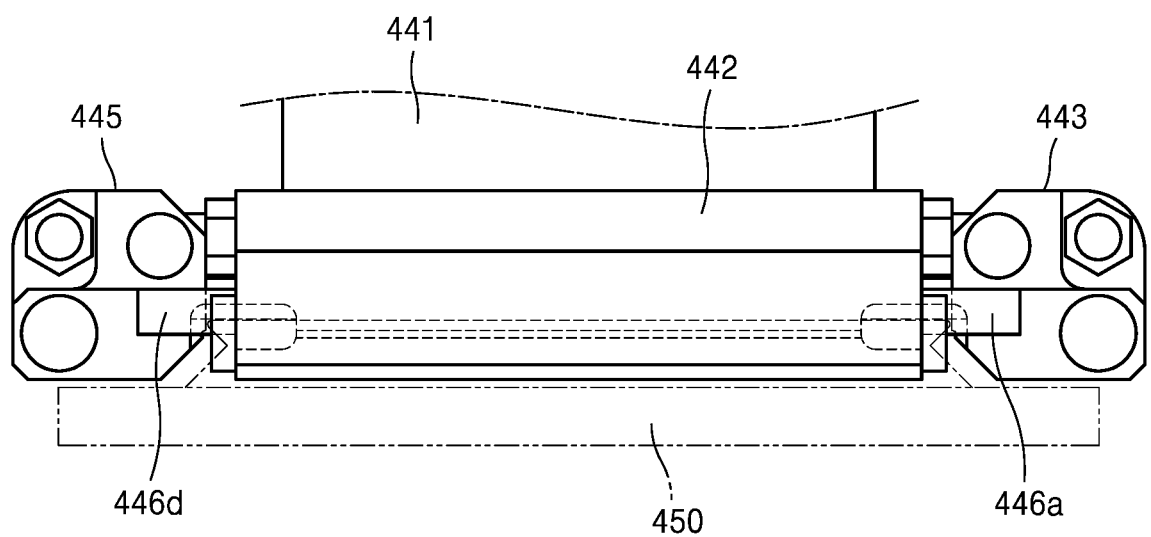

FIGS. 15A and 15B are schematic side views illustrating a method of bending a protective film 10 through the display device manufacturing apparatus 400 shown in FIG. 14A.

Referring to FIGS. 15A, 14A, and 14B, after the protective film 10 is disposed on the guide film GF as described above, the protective film 10 and the guide film GF may be disposed on the first jig 450 shown in FIG. 14A. In the above case, the guide film GF may be disposed to be seated on the first jig 450. In this case, the first rotation jig 442, the second rotation jig 443, the third rotation jig 444, and the fourth rotation jig 445 may maintain a tilted state, as shown in FIGS. 15A, 14A, and 14B.

Referring to FIGS. 15B, 14A, and 14B, the second jig portion 440 may be linearly moved by the driver 420 to bring the second jig portion 440 closer to the first jig 450. In this case, the contact portion 441a of the second jig 441 may contact the protective film 10. The first stopper 461 may start to be inserted into the second stopper 462.

When the driver 420 continues to operate, the second jig 441 may press the protective film 10 and may no longer move. In this case, the first rotation jig 442, the second rotation jig 443, the third rotation jig 444, and the fourth rotation jig 445 may contact at least one of the second body 413 and the first jig 450. In this case, the first rotation jig 442, the second rotation jig 443, the third rotation jig 444, and the fourth rotation jig 445 may rotate about their respective rotation axes. In this case, as shown in FIG. 15B, the first rotation jig 442, the second rotation jig 443, the third rotation jig 444, and the fourth rotation jig 445 may be rotated as one surface of each of the first rotation jig 442, the second rotation jig 443, the third rotation jig 444, and the fourth rotation jig 445 completely contacts a flat surface of one of the second body 413 and the first jig 450. In this case, the elastic portion 447 shown in FIGS. 14A and 14B may be in a tensioned state compared to its initial length.

In above case, the first rotation jig 442, the second rotation jig 443, the third rotation jig 444, and the fourth rotation jig 445 may bend the side surface of the protective film 10. In this case, the side surface of the protective film 10 may bend toward the guide groove 451.

In addition, when the first rotation jig 442, the second rotation jig 443, the third rotation jig 444, and the fourth rotation jig 445 rotate, the first corner jig 446a, the second corner jig 446b, the third corner jig 446c, and the fourth corner jig 446d may also rotate. In this case, each corner of the protective film 10 may be round.

During the above process, the first heater 471 and the second heater 472 may apply heat to the protective film 10. In this case, when heat is applied as described above, the third layer 13 may be changed to a memorized shape and thus the edge of the protective film 10 may be smoothly round. In addition, as heat is also applied to other portions of the protective film 10, the shape of at least a portion of the protective film 10 may be smoothly changed.

When the above process is completed, the driver 420 may raise the second jig portion 440. In this case, the first rotation jig 442, the second rotation jig 443, the third rotation jig 444, and the fourth rotation jig 445 may rise together with the second jig 441, and a portion in contact with at least one of the second body 413 and the first jig 450 may be reduced. In this case, the elastic portion 447 may provide an elastic force to at least one of the first rotation jig 442, the second rotation jig 443, the third rotation jig 444, and the fourth rotation jig 445 to thereby restore at least one of the first rotation jig 442, the second rotation jig 443, the third rotation jig 444, and the fourth rotation jig 445 to a tilted initial position, as shown in FIGS. 14A and 14B.

FIGS. 16A to 16E are schematic side views illustrating a part of a method of manufacturing a display device 1, according to an embodiment.

Figure 16A:
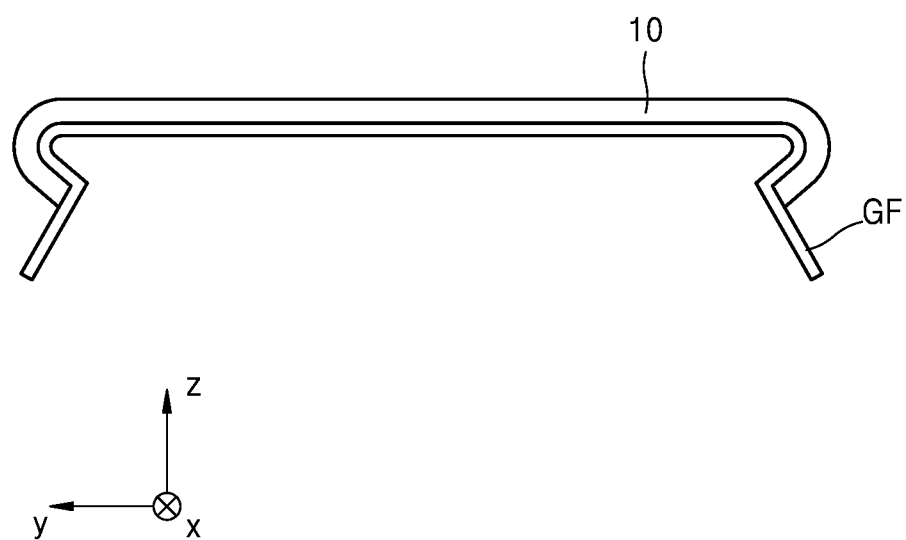
FIGS. 16A to 16E are schematic side views illustrating a part of a method of manufacturing a display device, according to an embodiment.

Referring to FIG. 16A, when the above processes are completed, the protective film 10 may maintain a bent state on the guide film GF. In this case, the protective film may have a shape that is the same as or similar to that shown in FIG. 15A. In another embodiment, the protective film 10 may maintain a more bent state than that shown in FIG. 16A.

Figure 16B:
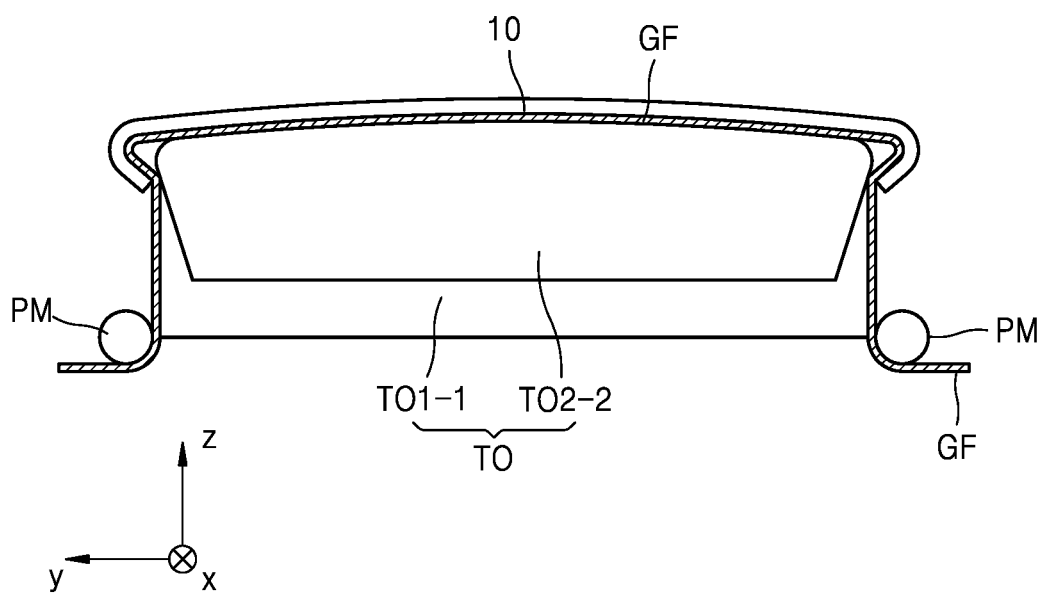

Referring to FIG. 16B, the deformed protective film 10 may be disposed on the second lamination device TO2. The second lamination device TO2 may be formed to have various shapes. For example, the second lamination device TO2 may include a roller. In this case, the roller may linearly move along one surface of the guide film GF to attach the protective film 10 to the display panel 20. In another embodiment, the second lamination device TO2 may be a device having a variable volume. Hereinafter, for convenience of description, a case, in which the second lamination device TO2 is a device having a variable volume, will be described in detail.

The second lamination device TO2 may include a second support portion TO2-1 and a second volume change portion TO2-2. The second support portion TO2-1 may support the second volume change portion TO2-2, and the second volume change portion TO2-2 may be a device having a variable volume. In this case, the second volume change portion TO2-2 may have a shape that is the same as or similar to the shape of the first volume change portion TO1-2 described above. Hereinafter, for convenience of description, a case, in which the second volume change portion TO2-2 includes a silicon pad, will be described in detail.

The rear surface of the protective film 10 may be arranged to face the second lamination device TO2. That is, the guide film GF may be arranged to be placed on the side of the second lamination device TO2. Next, the protective film 10 and the second lamination device TO2 may be aligned. In this case, a portion of the guide film GF may be disposed on the push member PM. In another embodiment, although not shown in the drawings, opposite ends of the guide film GF may be fixed by clamps or the like.

Figure 16C:
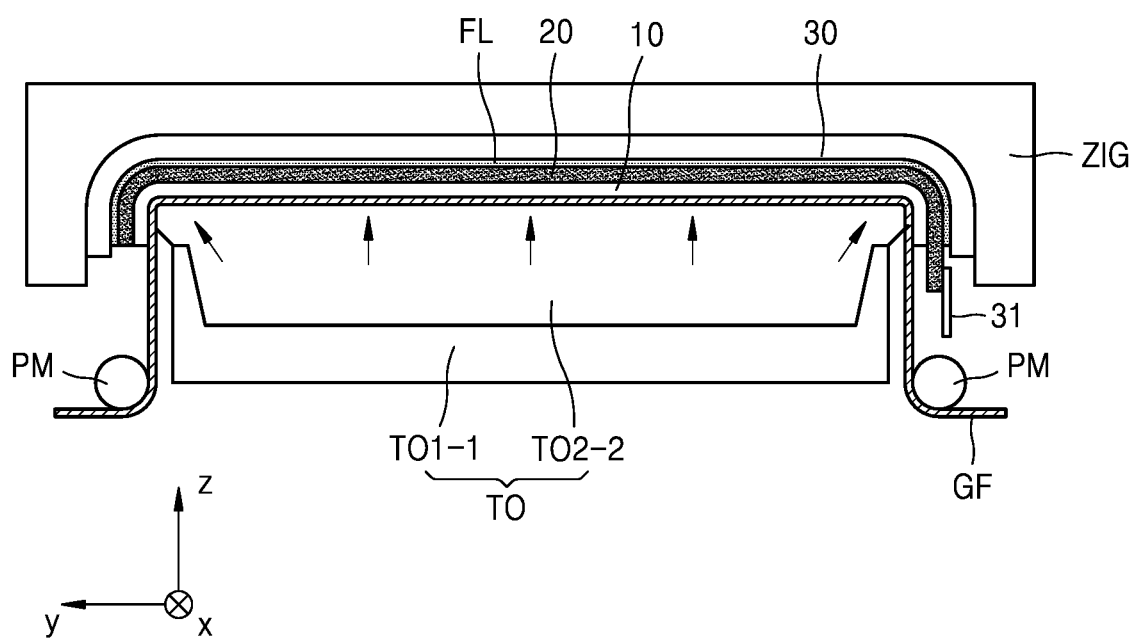

Referring to FIG. 16C, the preformed protective film 10 may be attached to the rear surface of the display panel 20. In this case, although not shown in the drawings, an adhesive layer may be disposed on the upper surface of the protective film 10 or the rear surface of the display panel 20. In this case, because a method of attaching the protective film 10 to the display panel 20 is similar to the method of attaching the display panel 20 to the cover window 30, described with reference to FIGS. 12G and 12H, a detailed description thereof is be omitted.

Figure 16D:
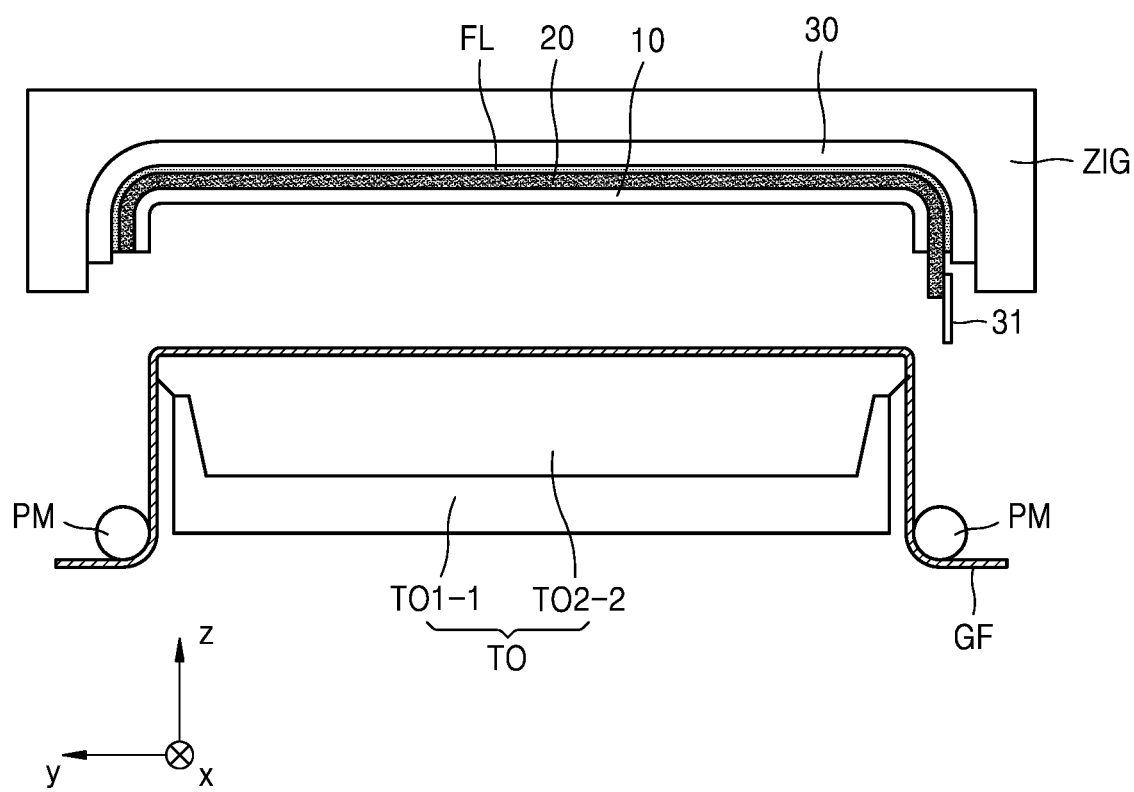

Referring to FIG. 16D, after the protective film 10 is attached to the display panel the guide film GF may be separated from the protective film 10. In another embodiment, the push member PM may be removed without separating the guide film GF from the protective film 10 to thereby separate the second lamination device TO2 from the protective film 10 with the guide film GF attached to the protective film 10.

Figure 16E:
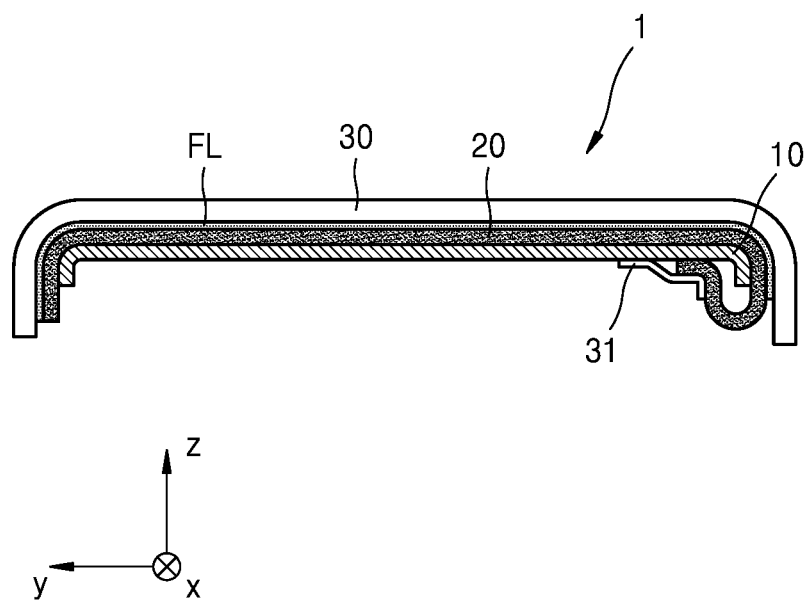

Referring to FIG. 16E, after the protective film 10 is attached to the rear surface of the display panel 20, a portion of the display panel 20 may bend to attach the display circuit board 31 to the rear surface of the protective film 10. In this case, although not shown in the drawings, a spacer including a material such as PET may be disposed on the rear surface of the protective film 10 to thereby dispose the display circuit board 31 on the spacer.

In the above case, the protective film 10 may attach the display panel 20 to the cover window 30 in a state in which the protective film 10 is attached to the display panel Although not shown in the drawings, in this case, the protective film 10, the display panel 20, the functional layer FL, and the cover window 30 may have the same shapes as those shown in FIG. 16D when the operations of FIGS. 12A to 121 are performed.

In addition, at least a portion of the display panel 20 may bend, and the display circuit board 31 may be attached to the rear surface of the protective film 10 or to a spacer disposed on the rear surface of the protective film 10.

Accordingly, the method of manufacturing a display device 1 may prevent a corner area of the protective film 10 from being damaged when the protective film 10 is formed through the third layer 13. In addition, in the method of manufacturing a display device 1, a round corner area of the protective film 10 may be formed through the third layer 13.

The display device according to the embodiments may maintain a curve. In addition, the display device according to the embodiments may display an image through a three-dimensional shape.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A protective film comprising:
   a first layer having a middle area, a first side area connected to a first edge of the middle area, a second side area connected to a second edge intersecting with the first edge of the middle area, and a corner area connecting the first side area to the second side area;
   a second layer disposed on the first layer and exposing at least a portion of at least one of the corner area, the first side area, and the second side area of the first layer; and
   a third layer disposed on the exposed at least a portion of the at least one of the corner area, the first side area, and the second side area of the first layer, the third layer comprising a shape memory alloy.

2. The protective film of claim 1, wherein a planar shape of the third layer is a sectoral shape.

3. The protective film of claim 1, wherein the third layer comprises:
   a first portion disposed on the corner area; and
   a second portion disposed on the first side area or the second side area.

4. The protective film of claim 1, wherein the third layer is disposed on an edge of the corner area, and the second layer is disposed on a portion of the corner area except for the edge of the corner area.

5. The protective film of claim 1, wherein the corner area comprises a first area and a second area,
wherein the second layer covers the middle area, the first side area, the second side area, and the first area of the first layer and exposes the second area of the first layer.

6. The protective film of claim 5, wherein the third layer is disposed on the second area.

7. The protective film of claim 5, wherein the first area is provided in plurality and the second area is provided in plurality,
wherein the plurality of first areas and the plurality of second areas are alternately arranged in the corner area.

8. The protective film of claim 1, wherein the second layer comprises a metal.

9. The protective film of claim 1, wherein at least a portion of a planar shape of the third layer is round.

10. The protective film of claim 1, wherein the first layer comprises:
an embossed member;
a cushion layer connected to the embossed member; and
an outer skin layer connected to the cushion layer.

11. A display device comprising:
a cover member;
a display panel disposed on one surface of the cover member; and
a protective film disposed on one surface of the display panel,
wherein the protective film comprises:
a first layer having a middle area, a first side area connected to a first edge of the middle area, a second side area connected to a second edge intersecting with the first edge of the middle area, and a corner area connecting the first side area to the second side area;
a second layer disposed on the first layer and exposing at least a portion of at least one of the corner area, the first side area, and the second side area of the first layer; and
a third layer disposed on the exposed at least a portion of the at least one of the corner area, the first side area, and the second side area of the first layer, the third layer comprising a shape memory alloy.

12. The display device of claim 11, wherein a planar shape of the third layer is a sector shape.

13. The display device of claim 11, wherein the third layer comprises:
a first portion disposed on the corner area; and
a second portion disposed on the first side area or the second side area.

14. The display device of claim 11, wherein the third layer is disposed on an edge of the corner area, and the second layer is disposed on a portion of the corner area except for the edge of the corner area.

15. The display device of claim 11, wherein the corner area comprises a first area and a second area,
wherein the second layer covers the middle area, the first side area, the second side area, and the first area of the first layer and exposes the second area of the first layer.

16. The display device of claim 15, wherein the third layer is disposed on the second area.

17. The display device of claim 15, wherein the first area is provided in plurality and the second area is provided in plurality,
wherein the plurality of first areas and the plurality of second areas are alternately arranged in the corner area.

18. The display device of claim 11, wherein the second layer comprises a metal.

19. The display device of claim 11, wherein at least a portion of a planar shape of the third layer is round.

20. The display device of claim 11, wherein the first layer comprises:
an embossed member;
a cushion layer connected to the embossed member; and
an outer skin layer connected to the cushion layer.

* * * * *